(12) United States Patent
Nakaki

(10) Patent No.: US 11,322,514 B2
(45) Date of Patent: May 3, 2022

(54) SEMICONDUCTOR STORAGE DEVICE AND MANUFACTURING METHOD THEREOF

(71) Applicant: KIOXIA CORPORATION, Tokyo (JP)

(72) Inventor: Hiroshi Nakaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 12 days.

(21) Appl. No.: 16/806,540

(22) Filed: Mar. 2, 2020

(65) Prior Publication Data
US 2020/0402999 A1    Dec. 24, 2020

(30) Foreign Application Priority Data

Jun. 19, 2019   (JP) .............................. JP2019-113443

(51) Int. Cl.
| | | |
|---|---|---|
| H01L 27/11582 | (2017.01) | |
| H01L 23/528 | (2006.01) | |
| H01L 27/1157 | (2017.01) | |
| H01L 27/11524 | (2017.01) | |
| H01L 27/11556 | (2017.01) | |
| G11C 16/04 | (2006.01) | |
| H01L 27/11519 | (2017.01) | |
| H01L 27/11565 | (2017.01) | |

(52) U.S. Cl.
CPC .... *H01L 27/11582* (2013.01); *G11C 16/0483* (2013.01); *H01L 23/528* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ........... H01L 27/11582; H01L 27/1157; H01L 27/11519; H01L 27/11565; H01L 27/11524; H01L 27/11556; H01L 27/0207; H01L 23/528; G11C 16/0483; G11C 5/063
See application file for complete search history.

(56) References Cited

U.S. PATENT DOCUMENTS

| | | | |
|---|---|---|---|
| 7,910,432 B2 | 3/2011 | Tanaka et al. | |
| 2013/0248977 A1* | 9/2013 | Mori .................... | H01L 29/161 257/326 |
| 2016/0071865 A1* | 3/2016 | Yanai ................. | H01L 27/11565 257/324 |
| 2016/0071866 A1* | 3/2016 | Shimojo ........... | H01L 27/11582 257/314 |
| 2020/0273876 A1* | 8/2020 | Kashima ........... | H01L 27/11565 |
| 2020/0286910 A1* | 9/2020 | Kashima ........... | H01L 27/11524 |
| 2020/0303402 A1* | 9/2020 | Kobayashi ............ | G11C 5/063 |

* cited by examiner

*Primary Examiner* — Galina G Yushina
(74) *Attorney, Agent, or Firm* — Kim & Stewart LLP

(57) ABSTRACT

According to one embodiment, storage device comprises first wiring layers stacked along a first direction and a memory pillar extending through the first wiring layers. The memory pillar includes a first semiconductor layer. A second wiring layer is above an upper end of the memory pillar. A second semiconductor layer has a first portion between the first semiconductor layer and the second wiring layer and a second portion extending away from the first semiconductor layer. A first insulating layer is between the first portion and the second wiring layer in first direction, and also between the second portion and the second wiring layer in a second direction intersecting the first direction.

13 Claims, 41 Drawing Sheets

SEMICONDUCTOR STORAGE DEVICE AND MANUFACTURING METHOD THEREOF

CROSS-REFERENCE TO RELATED APPLICATION

This application is based upon and claims the benefit of priority from Japanese Patent Application No. 2019-113443, filed on Jun. 19, 2019, the entire contents of which are incorporated herein by reference.

FIELD

Embodiments described herein relate generally to a semiconductor storage device and a manufacturing method thereof.

BACKGROUND

As a semiconductor storage device, a three-dimensionally stacked NAND-type flash memory is known.

DETAILED DESCRIPTION

Figure 1:
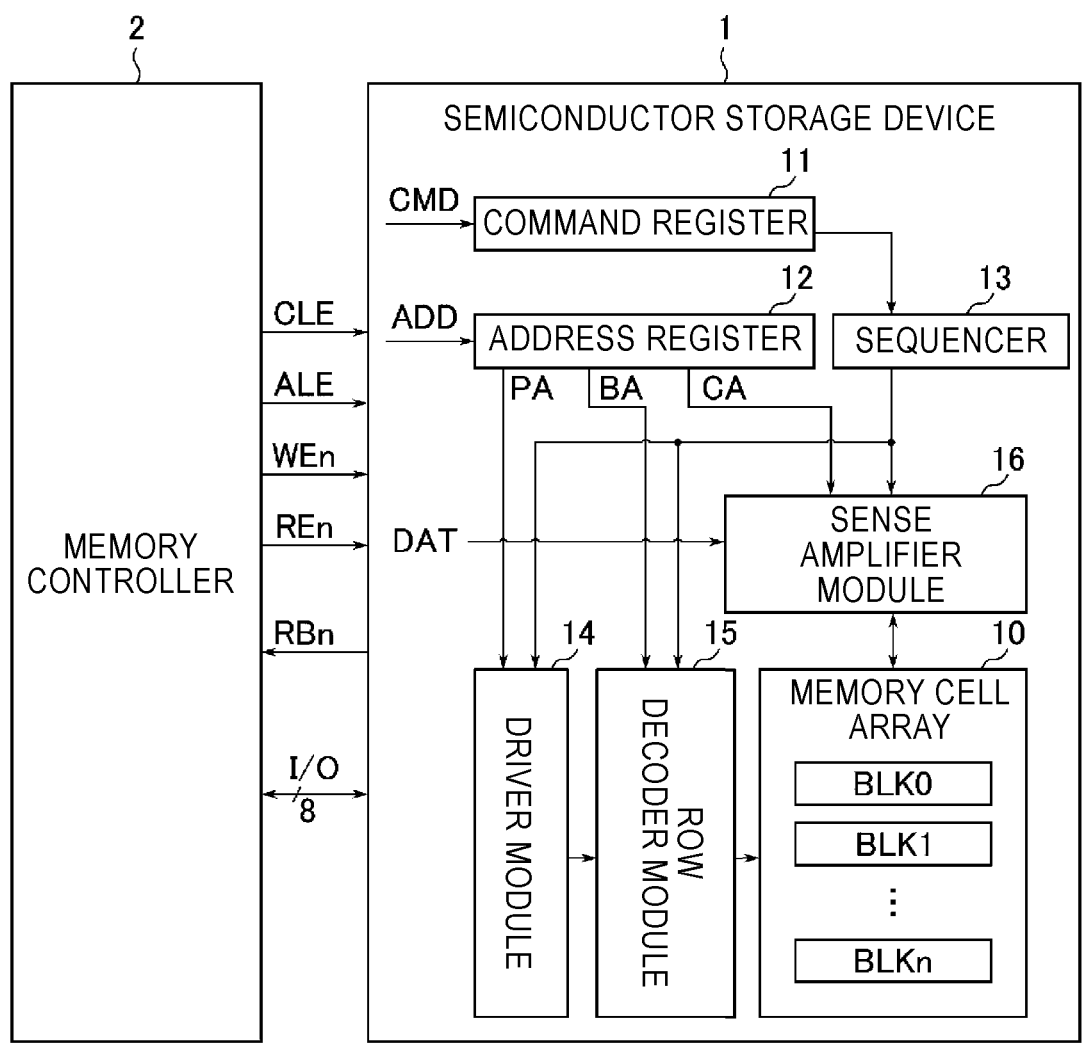
FIG. 1 is a block diagram illustrating a configuration example of a semiconductor storage device according to a first embodiment.

In general, according to one embodiment, a semiconductor storage device includes a plurality of first wiring layers stacked in a first direction. A first memory pillar has a first semiconductor layer and extends in the first direction through the plurality of first wiring layers. A second wiring layer is above an upper end of the first semiconductor layer in the first direction. A second semiconductor layer has a first portion between the first semiconductor layer and the second wiring layer in the first direction and a second portion extending away from the first semiconductor layer. A first insulating layer is between the first portion and the second wiring layer in first direction and between the second portion and the second wiring layer in a second direction intersecting the first direction.

Hereinafter, certain example embodiments will be described with reference to drawings. In the following descriptions, elements having substantially the same functions and configurations are denoted by common reference numerals, and redundant descriptions may be omitted. Example embodiments exemplify an apparatus or a method for embodying at least one technical concept of the present disclosure, but, in general, the described materials, the depicted shapes, structures, arrangements, etc. of components in the examples are not necessarily limitations. In general, various changes and modifications can be made to the example embodiments while still embodying the technical concept(s) of the present disclosure.

1. First Embodiment

A semiconductor storage device according to a first embodiment will be described. Hereinafter, as an example of the semiconductor storage device, a three-dimensionally stacked NAND-type flash memory in which memory cell transistors are three-dimensionally stacked on a semiconductor substrate will be described.

1.1 Configuration 1.1.1 Entire Configuration of Semiconductor Storage Device

First, an entire configuration of the semiconductor storage device will be described by using FIG. 1. FIG. 1 is an example of a block diagram illustrating a basic entire configuration of the semiconductor storage device.

As illustrated in FIG. 1, a semiconductor storage device 1 is controlled by, for example, an external memory controller 2. The semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of 1 or more). The block BLK is a set of a plurality of memory cells capable of storing data in a non-volatile manner, and is used as, for example, a data erasure unit.

In the memory cell array 10, a plurality of bit lines and a plurality of word lines are provided. Each memory cell is associated with, for example, one bit line and one word line. A configuration of the memory cell array 10 will be described below.

The command register 11 stores a command CMD received by the semiconductor storage device 1 from the memory controller 2. The command CMD includes, for example, instructions that cause the sequencer 13 to execute a read operation, a write operation, an erase operation, etc.

The address register 12 stores address information ADD received by the semiconductor storage device 1 from the memory controller 2. The address information ADD includes, for example, a block address BA, a page address PA, and a column address CA. For example, the block address BA, the page address PA, and the column address CA are used for selecting a block BLK, a word line, and a bit line, respectively.

The sequencer 13 controls the entire operation of the semiconductor storage device 1. For example, the sequencer 13 controls the driver module 14, the row decoder module 15, the sense amplifier module 16, etc. on the basis of the command CMD stored in the command register 11 to execute a read operation, a write operation, an erase operation, etc.

The driver module 14 generates a voltage used for a read operation, a write operation, an erase operation, etc. Then, the driver module 14 applies, for example, the generated voltage to a signal line corresponding to a selected word line on the basis of the page address PA stored in the address register 12.

The row decoder module 15 selects a block BLK in the corresponding memory cell array 10 on the basis of the block address BA stored in the address register 12. Then, the row decoder module 15 transmits, for example, the voltage applied to the signal line corresponding to the selected word line, to the selected word line in the selected block BLK.

The sense amplifier module 16 applies a voltage to each bit line according to write data DAT received from the memory controller 2 during a write operation. During a read operation, the sense amplifier module 16 determines data stored in a memory cell on the basis of the voltage of the bit line, and transmits the determination result as read data DAT to the memory controller 2.

The communication between the semiconductor storage device 1 and the memory controller 2 supports, for example, a NAND interface standard. For example, in the communication between the semiconductor storage device 1 and the memory controller 2, a command latch enable signal CLE, an address latch enable signal ALE, a write enable signal WEn, a read enable signal REn, a ready busy signal RBn, and an input/output signal I/O are used.

The input/output signal I/O is, for example, an 8-bit signal, and may include a command CMD, address information ADD, data DAT, or other information.

The command latch enable signal CLE is a signal indicating that the input/output signal I/O received by the semiconductor storage device 1 is a command CMD.

The address latch enable signal ALE is a signal indicating that the signal I/O received by the semiconductor storage device 1 is address information ADD.

The write enable signal WEn is a signal that instructs the semiconductor storage device 1 to input the input/output signal I/O.

The read enable signal REn is a signal that instructs the semiconductor storage device 1 to output the input/output signal I/O.

The ready busy signal RBn is a signal that notifies the memory controller 2 whether the semiconductor storage device 1 is in a ready state in which instruction from the memory controller 2 is acceptable or a busy state where the instruction is not acceptable.

The semiconductor storage device 1 and the memory controller 2 as described above may constitute a single semiconductor device through a combination thereof. Examples of such a semiconductor device may include a memory card such as an SD™ card, and a solid state drive (SSD).

1.1.2 Circuit Configuration of Memory Cell Array

Figure 2:
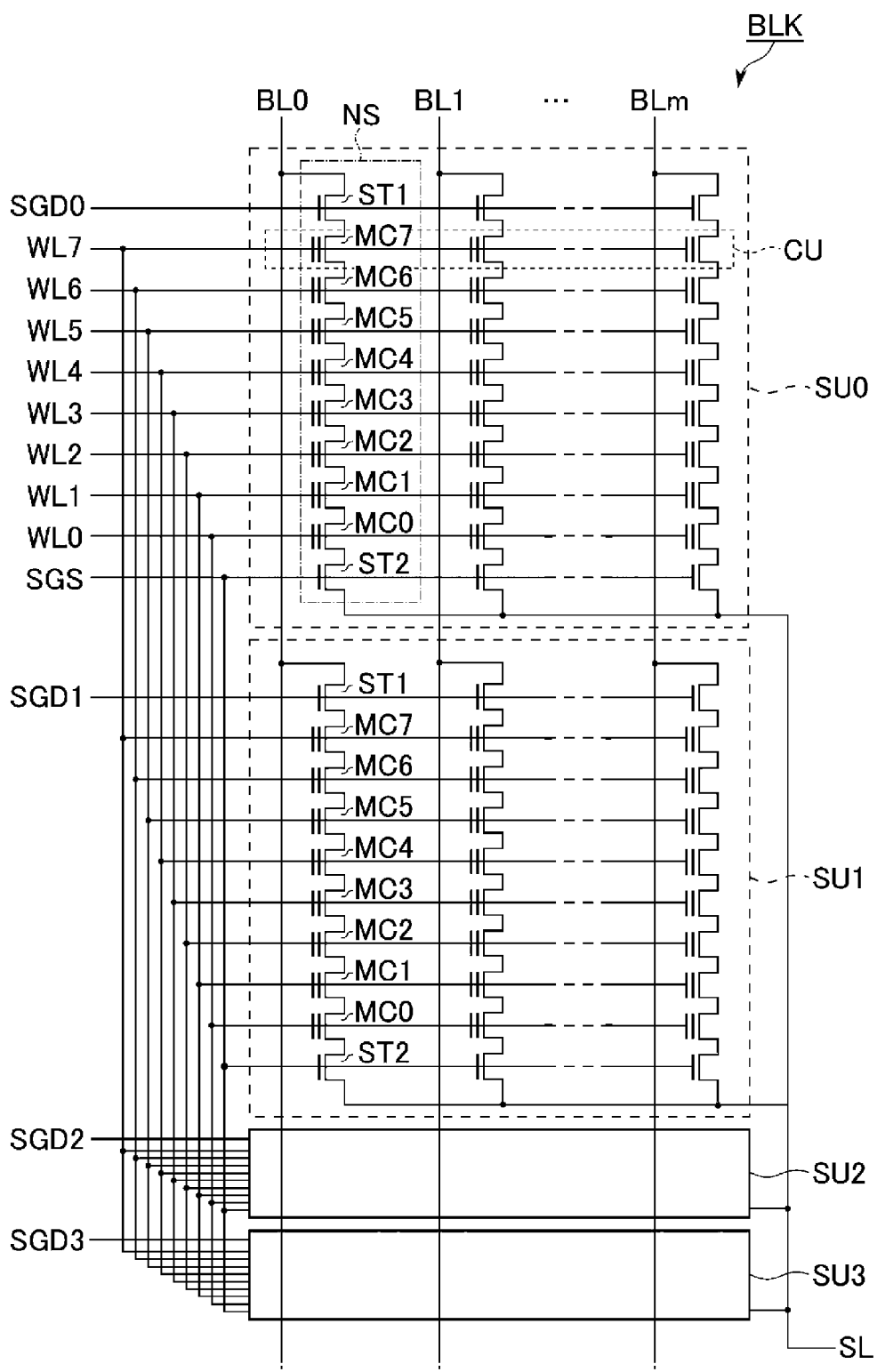
FIG. 2 is a circuit diagram of a memory cell array in the semiconductor storage device according to the first embodiment.

Next, an example of a circuit configuration of the memory cell array 10 will be described by using FIG. 2. In FIG. 2, one block BLK among the plurality of blocks BLK in the memory cell array 10 is extracted for illustration.

As illustrated in FIG. 2, each block BLK includes, for example, four string units SU0 to SU3. Each string unit SU includes a plurality of NAND strings NS.

The plurality of NAND strings NS are associated with bit lines BL0 to BLm (where m is an integer of 1 or more), respectively. Each NAND string NS includes, for example, memory cell transistors MC0 to MC7, and select transistors ST1 and ST2.

The memory cell transistor MC includes a control gate and a charge storage layer, and stores data in a non-volatile manner. Each of the select transistors ST1 and ST2 is used for selection of the string unit SU at the time of various operations.

The memory cell transistor MC may be a MONOS type transistor using an insulating film for the charge storage layer, or may be an FG type transistor using a conductive layer for the charge storage layer. Hereinafter, in this embodiment, the MONOS type will be described as an example.

In each NAND string NS, a drain of the select transistor ST1 is connected to the associated bit line BL, and a source of the select transistor ST1 is connected to one end of the memory cell transistors MC0 to MC7 connected in series. In the same block BLK, the gates of the select transistors ST1 in the string units SU0 to SU3 are, respectively, connected in common to select gate lines SGD0 to SGD3. The select gate lines SGD0 to SGD3 are connected to the row decoder module 15.

In each NAND string NS, a drain of the select transistor ST2 is connected to the other end of the memory cell transistors MC0 to MC7 connected in series. In the same block BLK, the sources of the select transistors ST2 are connected in common to a source line SL, and the gates of the select transistors ST2 are connected in common to a select gate line SGS. The select gate line SGS is connected to the row decoder module 15.

A bit line BL is connected in common to the NAND strings NS of each of the string units SU0 to SU3 in each block BLK. In this example, the source line SL is connected in common to the plurality of blocks BLK.

A set of memory cell transistors MC connected to a common word line WL in one string unit SU is called, for example, a cell unit CU. For example, the storage capacity of the cell unit CU including the memory cell transistors MC, each of which stores 1-bit data, is defined as "one page data." The cell unit CU may have a storage capacity of two or more pages of data according to the number of bits of data stored in the memory cell transistor MC.

The circuit configuration of the memory cell array 10 in the semiconductor storage device 1 according to the present disclosure is not limited to the above described configuration. For example, the numbers of the memory cell transistors MC and the select transistors ST1 and ST2 in each NAND string NS may, in general, be any numbers according to device design selections. Likewise, the number of the string units SU in each block BLK may be any number according to the device design choices.

1.1.3 Planar Configuration of Memory Cell Array

Next, an example of a planar configuration of the memory cell array 10 will be described by using FIG. 3. The example of FIG. 3 illustrates a plan view of a block BLK, and a part of an insulating layer is omitted in order to simplify the description.

In the following description, the X direction is taken as substantially parallel to the semiconductor substrate and corresponds to the extension direction (length direction) of the word line WL. The Y direction is also substantially parallel to the semiconductor substrate, intersects the X direction, and corresponds to the extension direction (length direction) of the bit line BL. The Z direction is substantially orthogonal to the semiconductor substrate and corresponds to a direction intersecting the X direction and the Y direction.

Figure 3:
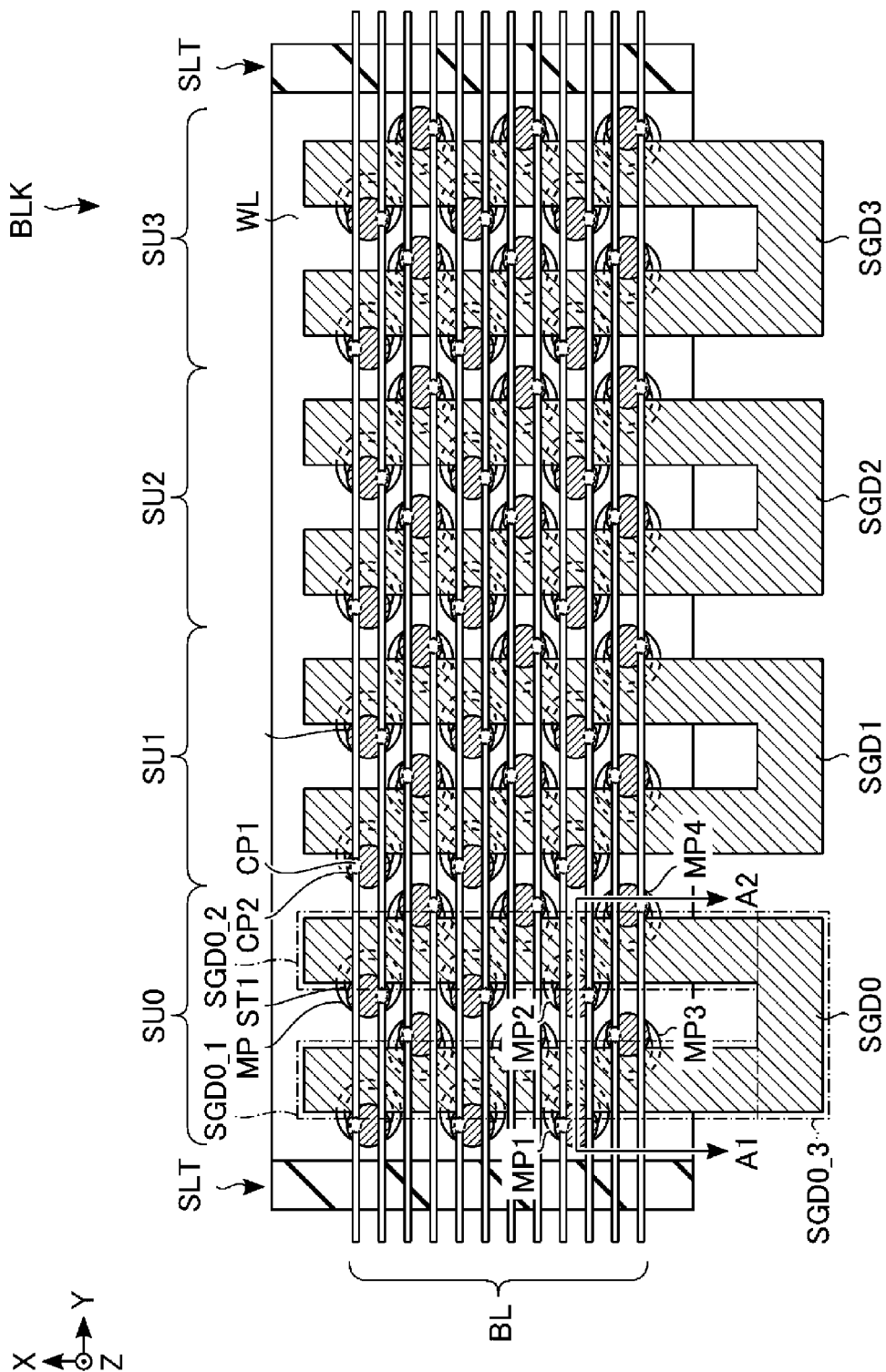
FIG. 3 is a plan view of the memory cell array in the semiconductor storage device according to the first embodiment.

As illustrated in FIG. 3, a slit SLT extending in the X direction is provided on each of two side surfaces facing the Y direction in the word line WL extending in the X direction. The select gate line SGS and word lines WL0 to WL7 are sequentially stacked above the semiconductor substrate. Then, the slit SLT separates, for example, the select gate line SGS and the word lines WL, for each block BLK.

For example, the string units SU0 to SU3 are arranged side by side in the Y direction, and a plurality of memory pillars MP is provided in each string unit SU.

The memory pillar MP corresponds to the NAND string NS. More specifically, the memory pillar MP corresponds to the memory cell transistors MC0 to MC7 and the select transistor ST2 in the NAND string NS. The memory pillar MP penetrates (passes through) the select gate line SGS and the word lines WL0 to WL7, and extends in the Z direction. The structure of the memory pillar MP will be described below.

For example, the plurality of memory pillars MP in each string unit SU is arranged in four rows of staggered arrangement in the X direction. That is, in a block BLK, the memory pillars MP are arranged in 16 rows in a staggered pattern along the X direction. More specifically, for example, in the string unit SU0, a memory pillar MP1 and a memory pillar MP2 are arranged adjacent to each other in the Y direction, and a memory pillar MP3 and a memory pillar MP4 are arranged adjacent to each other in the Y direction. Then, the memory pillar MP3 is arranged between the memory pillar MP1 and the memory pillar MP2 in the Y direction, and is arranged at a different position from the memory pillars MP1 and MP2 in the X direction. The memory pillar MP2 is arranged between the memory pillar MP3 and the memory pillar MP4 in the Y direction, and is arranged at a different position from the memory pillars MP3 and MP4 in the X direction.

The arrangement of the memory pillars MP may be chosen freely. For example, the arrangement of the memory pillars MP may be eight rows of staggered pattern, or 20 rows of staggered pattern. The arrangement of the memory pillars MP may not be a staggered pattern.

A select transistor ST1 is provided on each memory pillar MP. Then, the gates of the plurality of select transistors ST1 in each string unit SU are connected in common to the select gate line SGD.

In the example of FIG. 3, the select gate line SGD0 includes a select gate line SGD0_1 and a select gate line SGD0_2 extending in the X direction, and a select gate line SGD0_3 to which ends of the select gate line SGD0_1 and the select gate line SGD0_2 are connected. The select gate line SGD0_3 may be provided in a different layer from the select gate line SGD0_1 and the select gate line SGD0_2. In such a case, the select gate line SGD0_1 and the select gate line SGD0_2 can be connected to the select gate line SGD0_3 via contact plugs.

In the string unit SU0, the select gate line SGD0_1 is provided between the select transistor ST1 provided on the memory pillar MP1 and the select transistor ST1 provided on the memory pillar MP3. Similarly, the select gate line SGD0_2 is provided between the select transistor ST1 provided on the memory pillar MP2 and the select transistor ST1 provided on the memory pillar MP4. The same also applies to the other select gate lines SGD1 to SGD3.

A contact plug CP1 is formed on the select transistor ST1. A contact plug CP2 is formed on the contact plug CP1. The contact plug CP2 connects one of the bit lines BL extending in the Y direction to the contact plug CP1. That is, the memory pillars MP in the string unit SU are each connected to different bit lines BL, respectively, via the select transistors ST1 and the contact plugs CP1 and CP2. More specifically, for example, the memory pillars MP1 to MP4 are each connected to different bit lines BL, respectively. The memory pillars MP corresponding to each string unit SU are connected in common to one bit line BL.

1.1.4 Cross-Sectional Configuration of Memory Cell Array

Figure 4:
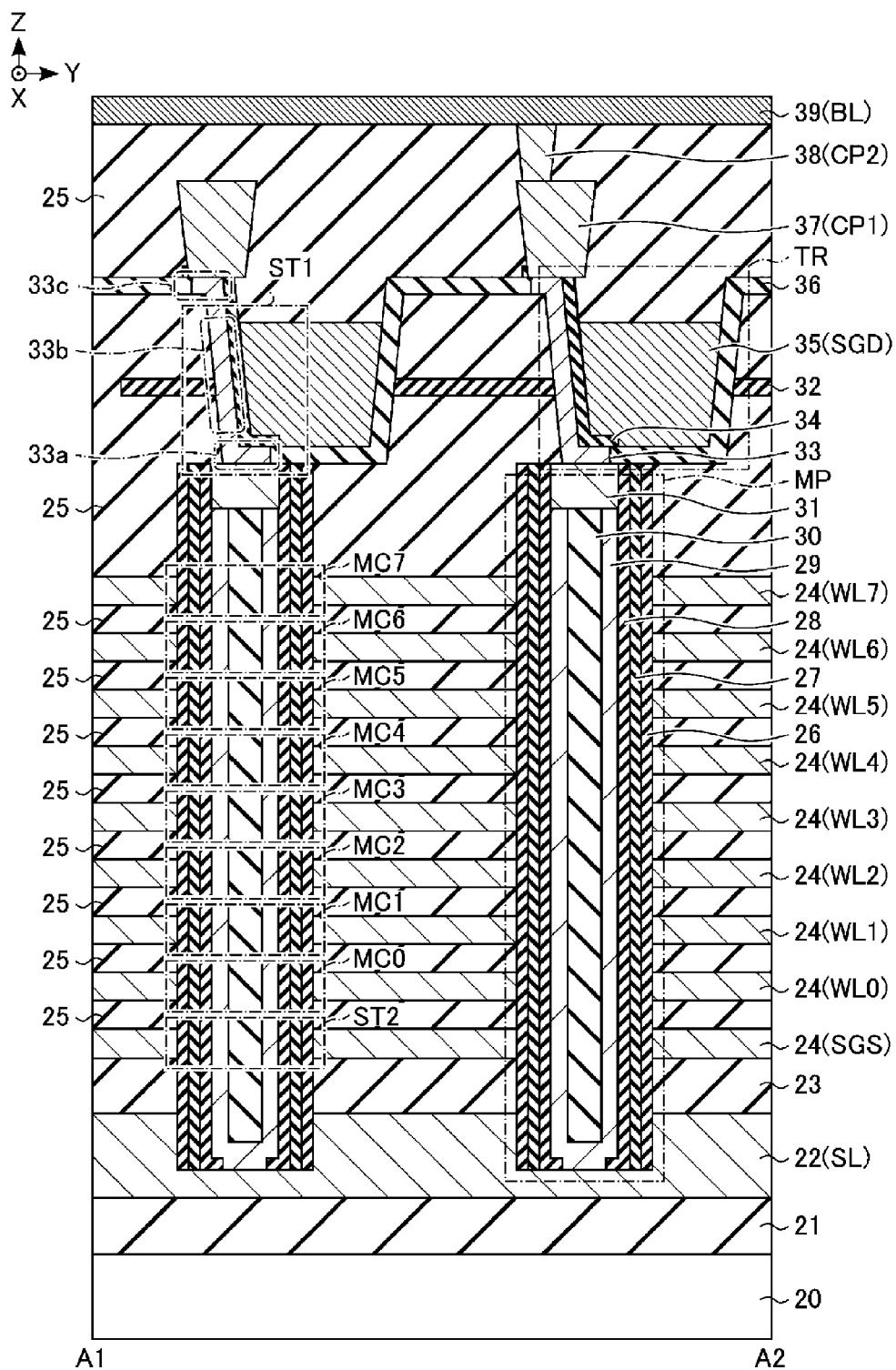
FIG. 4 is a cross-sectional view of the memory cell array in the semiconductor storage device according to the first embodiment.

Next, an example of a cross-sectional configuration of the memory cell array 10 will be described by using FIG. 4. FIG. 4 is a cross-sectional view taken along the A1-A2 line of FIG. 3.

As illustrated in FIG. 4, an insulating layer 21 is formed on a semiconductor substrate 20. For example, a silicon oxide film ($SiO_2$) is used for the insulating layer 21. Circuits, such as the row decoder module 15 or the sense amplifier module 16, may be provided on a region where the insulating layer 21 is formed (that is, between the semiconductor substrate 20 and a wiring layer 22).

The wiring layer 22 that extends in the X direction and functions as the source line SL is formed on the insulating layer 21. The wiring layer 22 is made of a conductive material, and, for example, an n-type semiconductor, a p-type semiconductor, or a metal material is used.

An insulating layer 23 is formed on the wiring layer 22. For example, $SiO_2$ is used for the insulating layer 23.

Nine wiring layers 24 functioning as the select gate line SGS and the word lines WL0 to WL7 in an order from the lower layer and nine insulating layers 25 are alternately stacked on the insulating layer 23.

The wiring layer 24 is made of a conductive material, and for example, an n-type semiconductor, a p-type semiconductor, or a metal material is used. Hereinafter, descriptions will be made for a case in which a stacked structure of titanium nitride (TiN) and tungsten (W) is used as the wiring layer 24. TiN has a function as a barrier layer of preventing the reaction between W and $SiO_2$ or as an adhesion layer of improving the adhesion of W when W is deposited by chemical vapor deposition (CVD). For example, $SiO_2$ is used for the insulating layer 25.

The memory pillar MP whose bottom surface reaches the wiring layer 22 is formed through the nine wiring layers 24. The memory pillar MP includes a block insulating film 26, a charge storage layer 27, a tunnel insulating film 28, a semiconductor layer 29, a core layer 30, and a cap layer 31.

More specifically, a hole corresponding to the memory pillar MP is formed through the plurality of wiring layers 24 and the plurality of insulating layers 25 such that the bottom thereof reaches the wiring layer 22. The block insulating film 26, the charge storage layer 27, and the tunnel insulating film 28 are sequentially stacked on the side surface of the hole. Then, the semiconductor layer 29 is formed such that the side surface thereof is in contact with the tunnel insulating film 28, and the bottom surface thereof is in contact with the wiring layer 22. The semiconductor layer 29 is a region where a channel of the select transistor ST2 and the memory cell transistors MC is formed. Therefore, the semiconductor layer 29 functions as a signal line that connects current paths of the select transistor ST2 and the memory cell transistors MC0 to MC7. The core layer 30 is provided in the semiconductor layer 29. Then, the cap layer 31 having a side surface in contact with the tunnel insulating film 28 is formed on the semiconductor layer 29 and the core layer 30. That is, the memory pillar MP includes the semiconductor layer 29 that passes through the inside of the plurality of wiring layers 24, and extends in the Z direction.

For example, $SiO_2$ is used for the block insulating film 26, the tunnel insulating film 28, and the core layer 30. For example, a silicon nitride film (SiN) is used for the charge storage layer 27. For example, polysilicon is used for the semiconductor layer 29 and the cap layer 31.

The memory cell transistors MC0 to MC7 are implemented by the memory pillar MP and the eight wiring layers 24 functioning as the word lines WL0 to WL7, respectively. Similarly, the select transistor ST2 is implemented by the memory pillar MP and the wiring layer 24 functioning as the select gate line SGS.

A wiring layer 35 extending in the X direction is formed above the memory pillar MP. The wiring layer 35 functions as the select gate line SGD. For example, the center position of the wiring layer 35 in the Y direction is different from the center position of the memory pillar MP. That is, the wiring layer 35 is disposed above the upper end of the semiconductor layer 29 in the Y direction. A semiconductor layer 33 and an insulating layer 34 are provided between the memory pillar MP and the wiring layer 35. The semiconductor layer 33 is a region where a channel of the select transistor ST1 is formed. The insulating layer 34 functions as a gate insulating film of the select transistor ST1.

More specifically, above the memory pillar MP, an insulating layer 32 that extends in the X direction and the Y direction is provided between the insulating layers 25. The insulating layer 32 functions as an etching stopper during processing of a trench TR (or a groove pattern). The insulating layer 32 may be omitted in some examples. The trench TR extending in the X direction is formed through the insulating layers 25 and 32 such that the bottom surface thereof reaches the memory pillar MP. The trench TR corresponds to the wiring layer 35. The semiconductor layer 33 and the insulating layer 34 are stacked on the side surface and the bottom surface of the trench TR above the memory pillar MP. An insulating layer 36 is formed on the side surface and the bottom surface of the trench TR except for a region where the semiconductor layer 33 and the insulating layer 34 are provided, and on a region between top sides of two trenches TR adjacent to each other in the Y direction. The wiring layer 35 is formed within the trench TR. The height position of the upper surface of the wiring layer 35 in the Z direction is lower than the top side of the trench TR (is closer to the semiconductor substrate 20). That is, the height position of the upper surface of the wiring layer 35 in the Z direction is lower than the upper surfaces of the semiconductor layer 33, the insulating layer 34, and the insulating layer 36. The insulating layer 36 provided in the region between top sides of the two trenches TR adjacent to each other in the Y direction may be omitted in some examples.

The semiconductor layer 33 has a shape that is bent substantially in the Z direction and the Y direction (hereinafter, referred to as a crank shape). More specifically, the semiconductor layer 33 includes semiconductor layers 33a to 33c. The semiconductor layer 33a is provided on the cap layer 31. The semiconductor layer 33a is disposed along the bottom surface of the wiring layer 35. That is, the semiconductor layer 33a extends in the Y direction on the YZ plane where the Y direction and the Z direction intersect. That is, the semiconductor layer 33a is disposed between the semiconductor layer 29 and the wiring layer 35. The bottom surface of the semiconductor layer 33b is in contact with the semiconductor layer 33a. The semiconductor layer 33b is disposed along the side surface of the wiring layer 35 facing the Y direction. That is, the semiconductor layer 33b extends substantially in the Z direction on the YZ plane. That is, the semiconductor layer 33b extends above the semiconductor layer 29. The Z direction substantially corresponds to a direction along which the side surface of the trench TR (or the wiring layer 35) facing the Y direction is directed upwards away from the memory pillar MP, and depends to some extent on the processed shape of the trench TR, which can relate to selected manufacturing techniques. The semiconductor layer 33c is in contact with the upper surface of the semiconductor layer 33b, and extends from a connection position with the semiconductor layer 33b on the YZ plane, in the Y direction opposite to that of the semiconductor layer 33a. In the Z direction, the height position of the bottom surface of the semiconductor layer 33c is higher than the height position of the upper surface of the wiring layer 35.

That is, the semiconductor layer 33 has a crank shape or a bent shape in which the semiconductor layer 33a extending in the Y direction, the semiconductor layer 33b extending substantially in the Z direction, and the semiconductor layer 33c extending in the Y direction are connected together. The semiconductor layer 33c may be omitted in some examples. In such a case, the semiconductor layer 33 has a crank shape formed by the semiconductor layer 33a and the semiconductor layer 33b.

The insulating layer 34 is provided between the semiconductor layer 33 and the wiring layer 35, and also has a crank shape that is bent substantially in the Z direction and the Y direction similarly to the semiconductor layer 33. More specifically, the insulating layer 34 includes a first portion provided on the semiconductor layer 33a, a second portion provided on the semiconductor layer 33b, and a third portion provided on the semiconductor layer 33c. That is, the insulating layer 34 has a crank shape in which the first portion extending in the Y direction, the second portion extending substantially in the Z direction, and the third portion extending in the Y direction are sequentially connected. The third portion of the insulating layer 34 may be omitted in some examples. In such a case, the insulating layer 34 has a crank shape formed by the first portion and the second portion.

The select transistor ST1 is implemented in the semiconductor layer 33, the insulating layer 34, and the wiring layer 35. A channel region of the select transistor ST1 is formed along the crank shape by the crank-shaped semiconductor layer 33 provided along the side surface and the bottom surface of the wiring layer 35 (that is, the semiconductor layer 33a and the semiconductor layer 33b).

For the insulating layer 32, an insulating material for which an etching selectivity with respect to the insulating layer 25 is obtained is used. Hereinafter, descriptions will be made for a case where SiN is used as the insulating layer 32. For example, polysilicon or amorphous silicon is used for the semiconductor layer 33. An n-type semiconductor or a p-type semiconductor into which an impurity is introduced may be used for the semiconductor layer 33c in order to connect a conductor 37 and the channel region of the select transistor ST1 with a low resistance. For example, $SiO_2$ is used for the insulating layer 34. The insulating layer 34 may have a stacked structure. For example, a MONOS structure in which a threshold voltage control is possible (more specifically, a stacked structure of an insulating layer, a charge storage layer, and an insulating layer) may be used. The wiring layer 35 is made of a conductive material, and for example, an n-type semiconductor, a p-type semiconductor, or a metal material is used. Hereinafter, descriptions will be made for a case where a stacked structure of TiN/W is used as the wiring layer 35. For example, $SiO_2$ is used for the insulating layer 36.

The conductor 37 functioning as the contact plug CP1 is formed on the semiconductor layer 33 (the semiconductor layer 33c).

A conductor 38 functioning as the contact plug CP2 is formed on the conductor 37.

A wiring layer 39 that functions as the bit line BL and extends in the Y direction is provided on the conductor 38.

The conductors 37 and 38 and the wiring layer 39 are made of a conductive material, and for example, a metal material is used.

1.1.5 Arrangement of Select Transistor ST1 and Select Gate Line SGD

Figure 5:
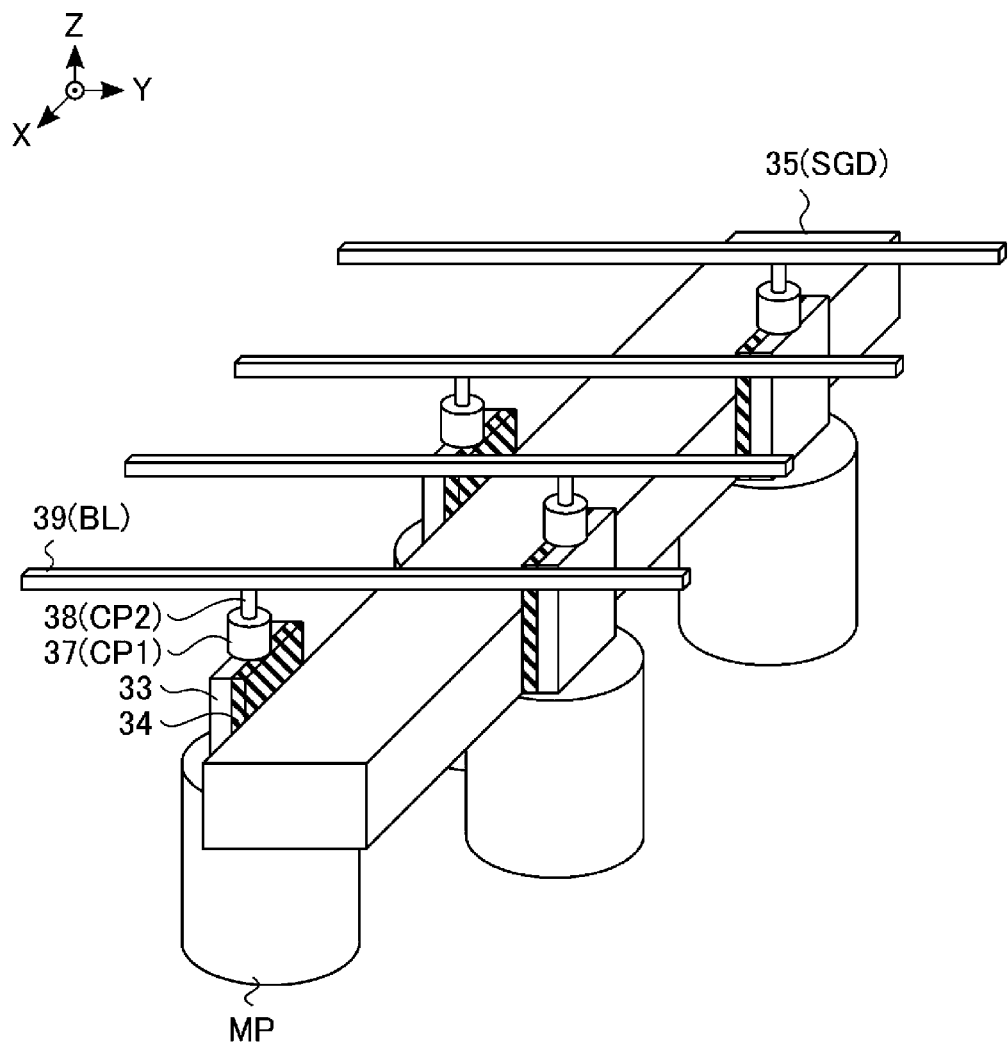
FIG. 5 is a perspective view of a select transistor ST1 in the memory cell array in the semiconductor storage device according to the first embodiment.

Next, an example of arrangement of the select transistor ST1 and the select gate line SGD will be described by using FIG. 5. FIG. 5 is a perspective view illustrating the arrangement of a top portion of the memory pillar MP, the select transistor ST1, the select gate line SGD, the contact plugs CP1 and CP2, and the bit line BL. In the example depicted in FIG. 5, in order to simplify description, a portion of the insulating layers and the bit lines BL is omitted. Also, the select transistor ST1 is somewhat simplified in depiction.

As illustrated in FIG. 5, for example, four memory pillars MP are arranged in two rows of staggered pattern along the X direction. The wiring layer 35 extending in the X direction passes above a part of a region of each memory pillar MP. Each semiconductor layer 33 is disposed on each memory pillar MP. Then, each insulating layer 34 is disposed between each semiconductor layer 33 and the wiring layer 35. On each semiconductor layer 33, the conductors 37 and 38 are stacked and provided in the Z direction, and the conductors 37 and the conductors 38 are connected to different wiring layers 39, respectively.

1.2 Manufacturing Method of Memory Cell Array

Next, an example of a manufacturing method of the memory cell array 10 will be described by using FIG. 6 to FIG. 14. Each of FIG. 6 to FIG. 14 illustrates a plan view and a cross-section taken along the B1-B2 line (a B1-B2 section) of the memory cell array 10 during stages of the manufacturing process.

Hereinafter, descriptions will be made for a case in which as a method of forming the wiring layers 24, a method of forming structures corresponding to the wiring layers 24 by sacrificial layers, and then removing the sacrificial layers and replacing the sacrificial layers with a conductive material (the wiring layers 24) (hereinafter, referred to as "replacement") is used.

Figure 6:
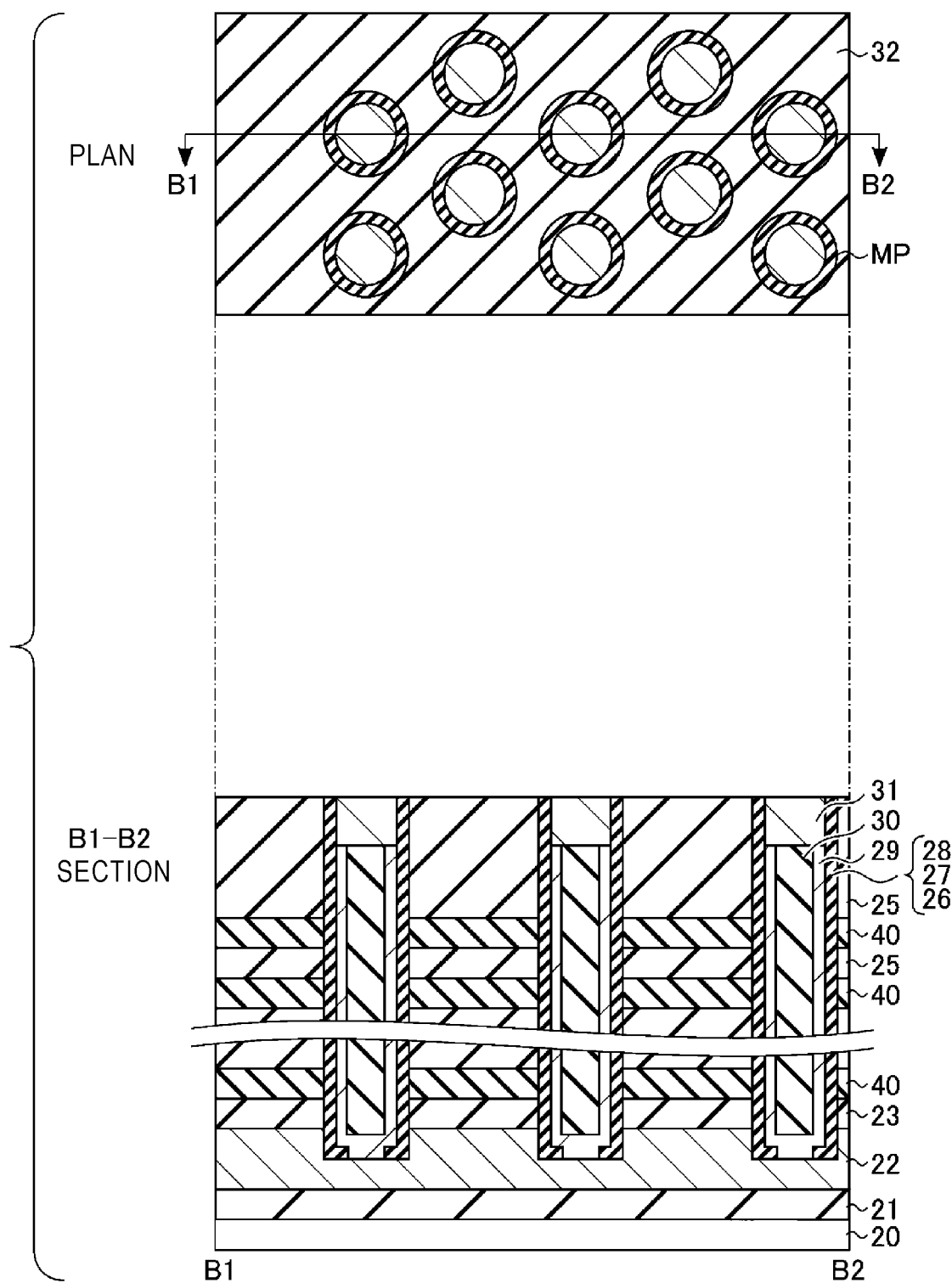
FIGS. 6-14 illustrate aspects of an example of a manufacturing process of a semiconductor storage device according to the first embodiment.

As illustrated in FIG. 6, the insulating layer 21, the wiring layer 22, and the insulating layer 23 are sequentially formed on the semiconductor substrate 20. Next, nine sacrificial layers 40 corresponding to the wiring layers 24 and the nine insulating layers 25 are alternately stacked. For the sacrificial layer 40, a material for which a wet-etching selectivity with respect to the insulating layer 25 can be obtained is used. Hereinafter, descriptions will be made for a case where SiN is used for the sacrificial layer 40.

Next, the memory pillar MP is formed. More specifically, first, a hole whose bottom reaches the wiring layer 22 is formed through the nine insulating layers 25, the nine sacrificial layers 40, and the insulating layer 23. Next, the block insulating film 26, the charge storage layer 27, and the tunnel insulating film 28 are sequentially stacked, and then the block insulating film 26, the charge storage layer 27, and the tunnel insulating film 28 on the uppermost insulating layer 25, and at the hole bottom surface are removed so that the wiring layer is exposed at the hole bottom surface. Next, the semiconductor layer 29 and the core layer 30 are formed to fill the hole. Next, the semiconductor layer 29 and the core layer 30 on the uppermost insulating layer 25 are removed. The semiconductor layer 29 and the core layer 30 in the upper portion of the hole are also removed. Next, the cap layer 31 is formed to fill the upper portion of the hole.

Figure 7:
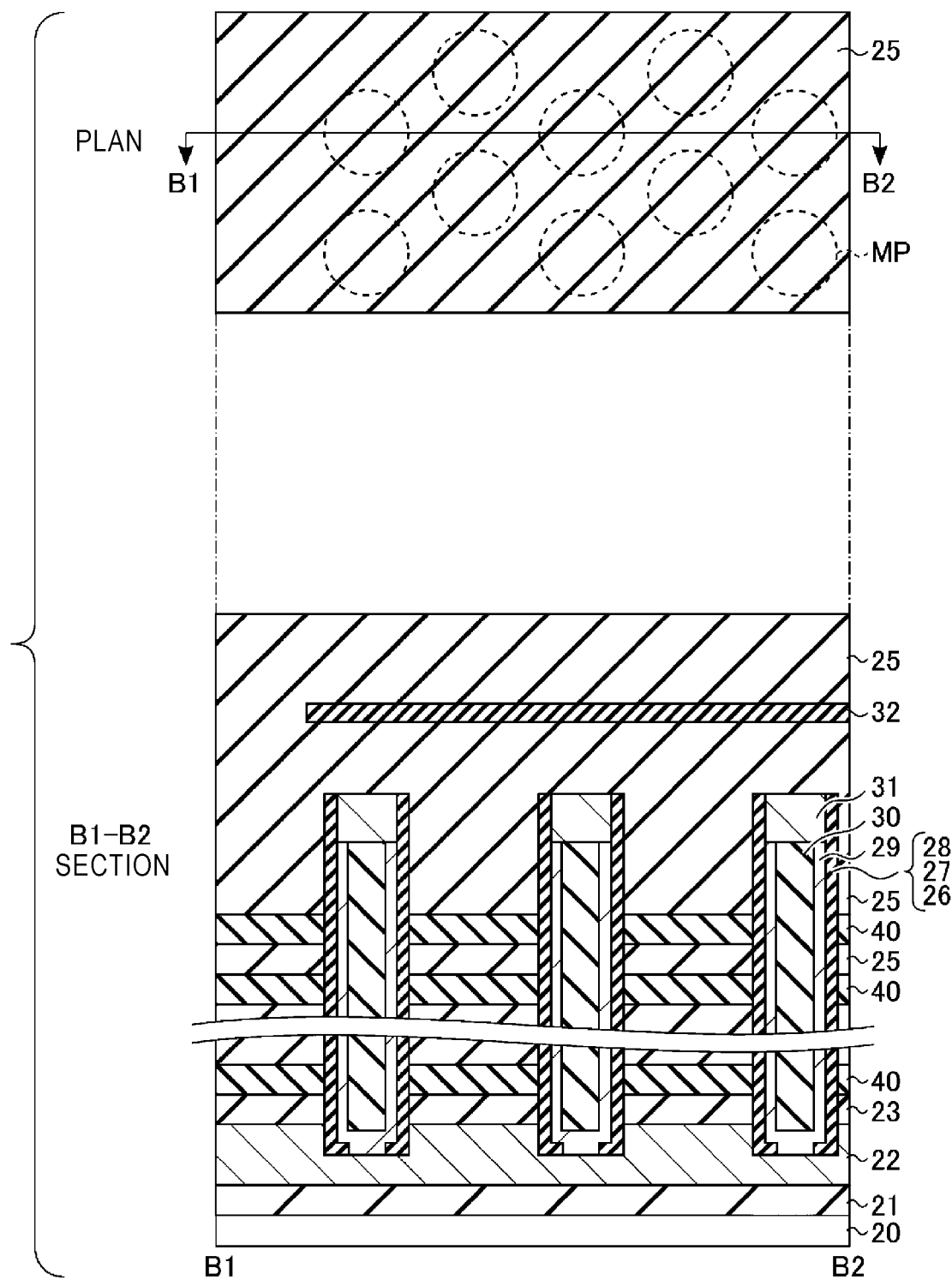

As illustrated in FIG. 7, after the insulating layer 25 is formed, the insulating layer 32 is formed to cover the upper surface of the memory pillar MP. Here, the insulating layer 32 in a region where the slit SLT will be formed later is removed.

Next, the insulating layer 25 is formed.

Figure 8:
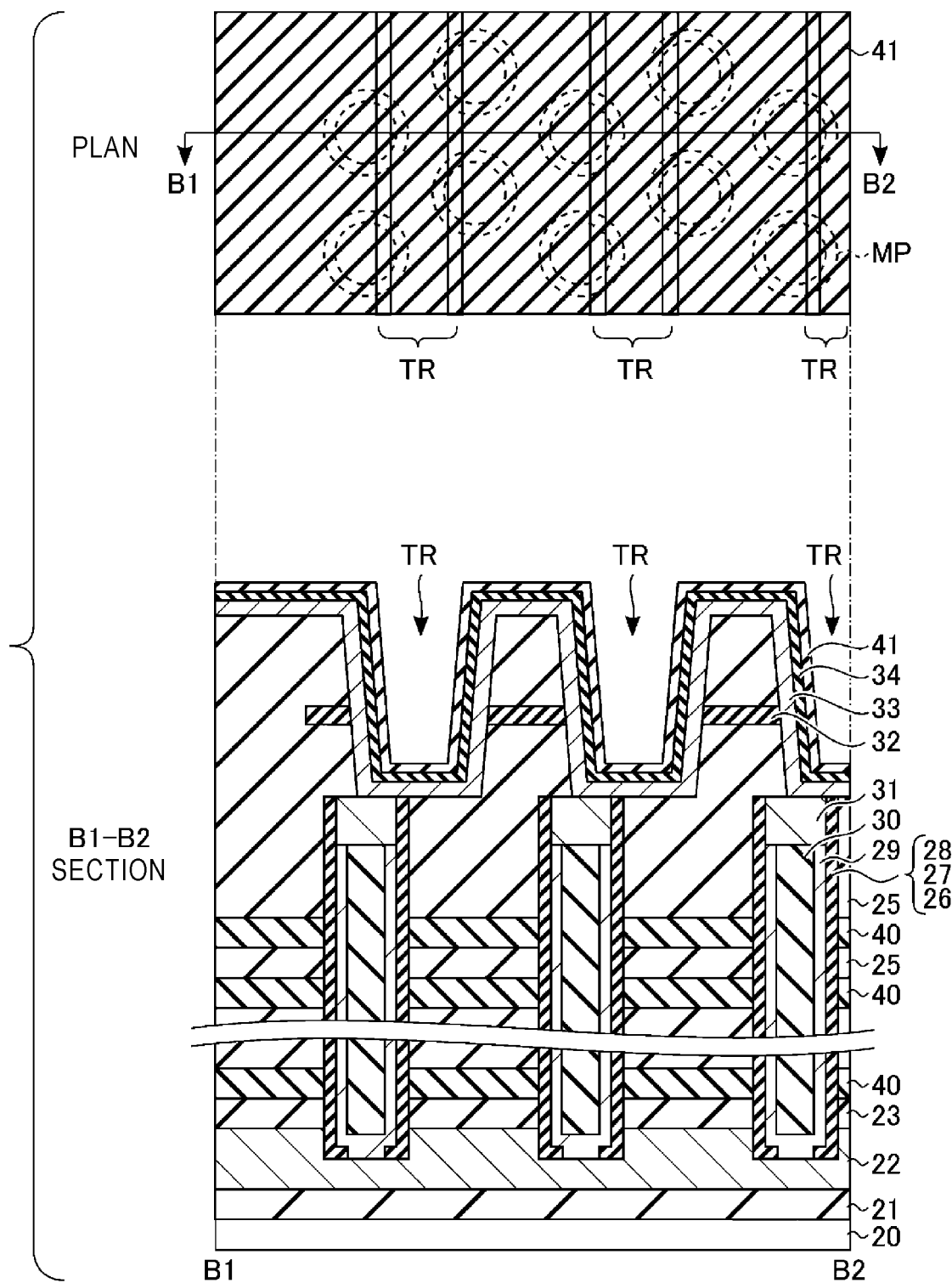

As illustrated in FIG. 8, the trench TR whose bottom surface reaches the memory pillar MP is formed. Here, for example, it is possible to reduce a processing damage of the upper surface of the memory pillar MP by using the insulating layer 32 as an etching stopper and processing the trench TR in two stages. At the bottom portion of the trench TR, a part of the top surface of each of the memory pillars MP arranged in two rows of staggered patterns is exposed.

Next, the semiconductor layer 33, the insulating layer 34, and an insulating layer 41 are sequentially stacked. The insulating layer 41 functions as, for example, a protective layer of the insulating layer 34. For the insulating layer 41, for example, a material for which a wet-etching selectivity with respect to the insulating layer 34 is obtained is used. Hereinafter, descriptions will be made for a case where SiN is used for the insulating layer 41.

Figure 9:
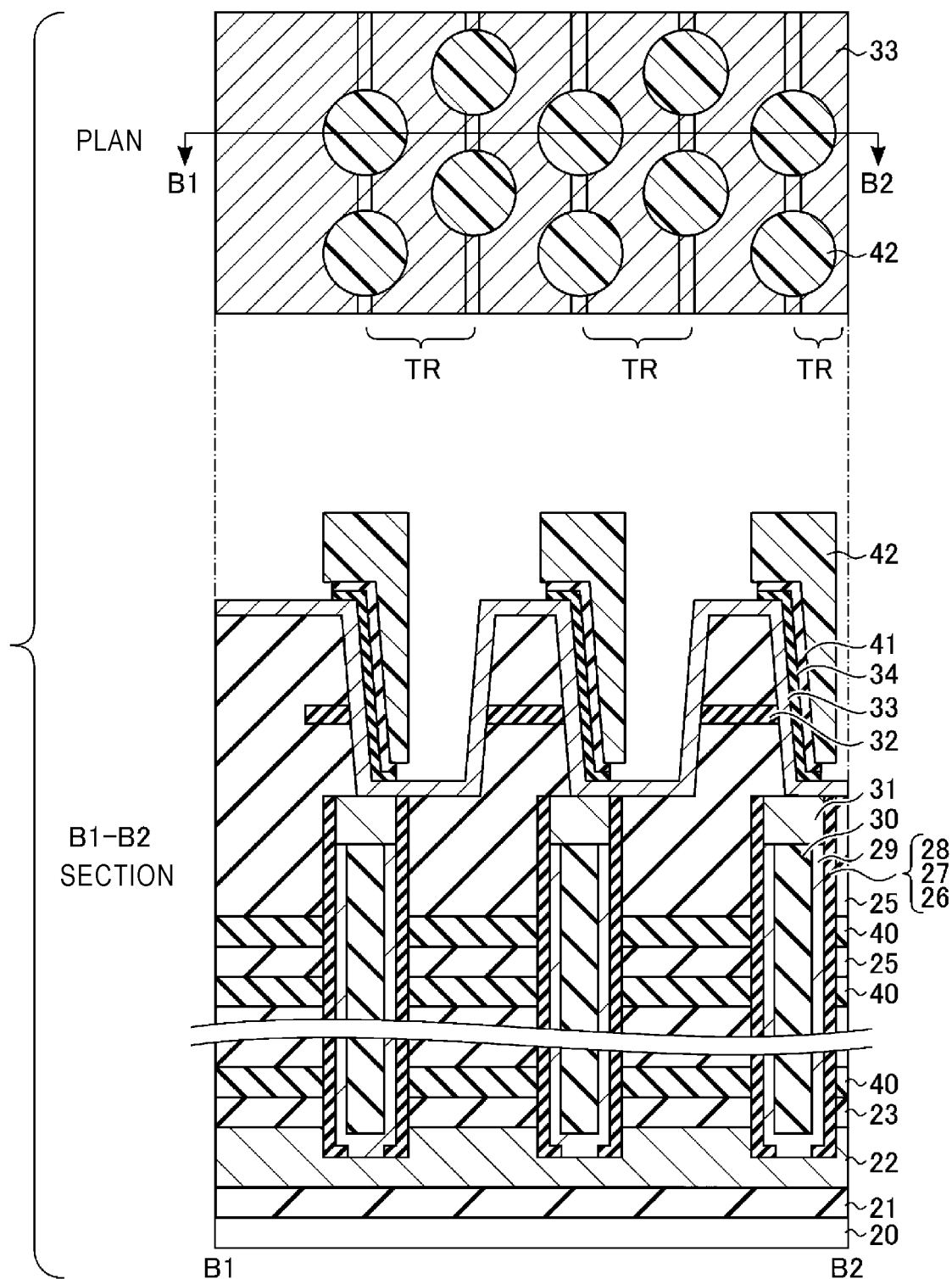

As illustrated in FIG. 9, a pillar using a resist 42 is formed above the memory pillar MP through photolithography. The semiconductor layer 33, the insulating layer 34, and the insulating layer 41 above the memory pillar MP are covered with the resist 42.

Next, the insulating layer 34 and the insulating layer 41 in a region not covered with the resist 42 are removed through, for example, a chemical dry etching (CDE).

Figure 10:
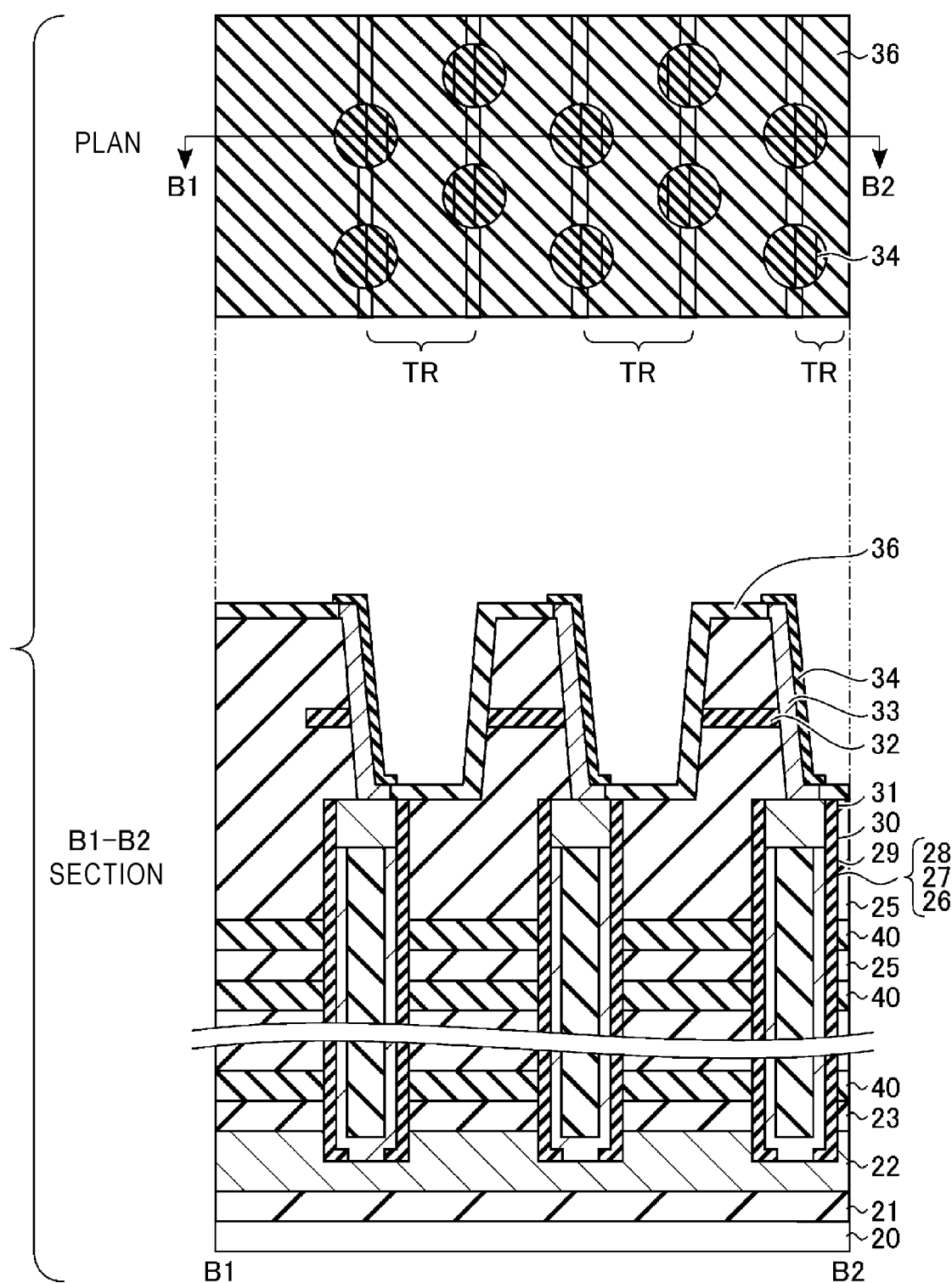

As illustrated in FIG. 10, after the resist 42 is removed, the semiconductor layer 33 is oxidized, and the insulating layer 36 is formed. Here, the semiconductor layer 33 in a region having a surface covered with the insulating layer 34 and the insulating layer 41 is not oxidized. An end region of the semiconductor layer 33 having a surface covered with the insulating layer 34 and the insulating layer 41 may be oxidized in some examples.

Next, for example, the insulating layer 41 is removed by wet etching.

Figure 11:
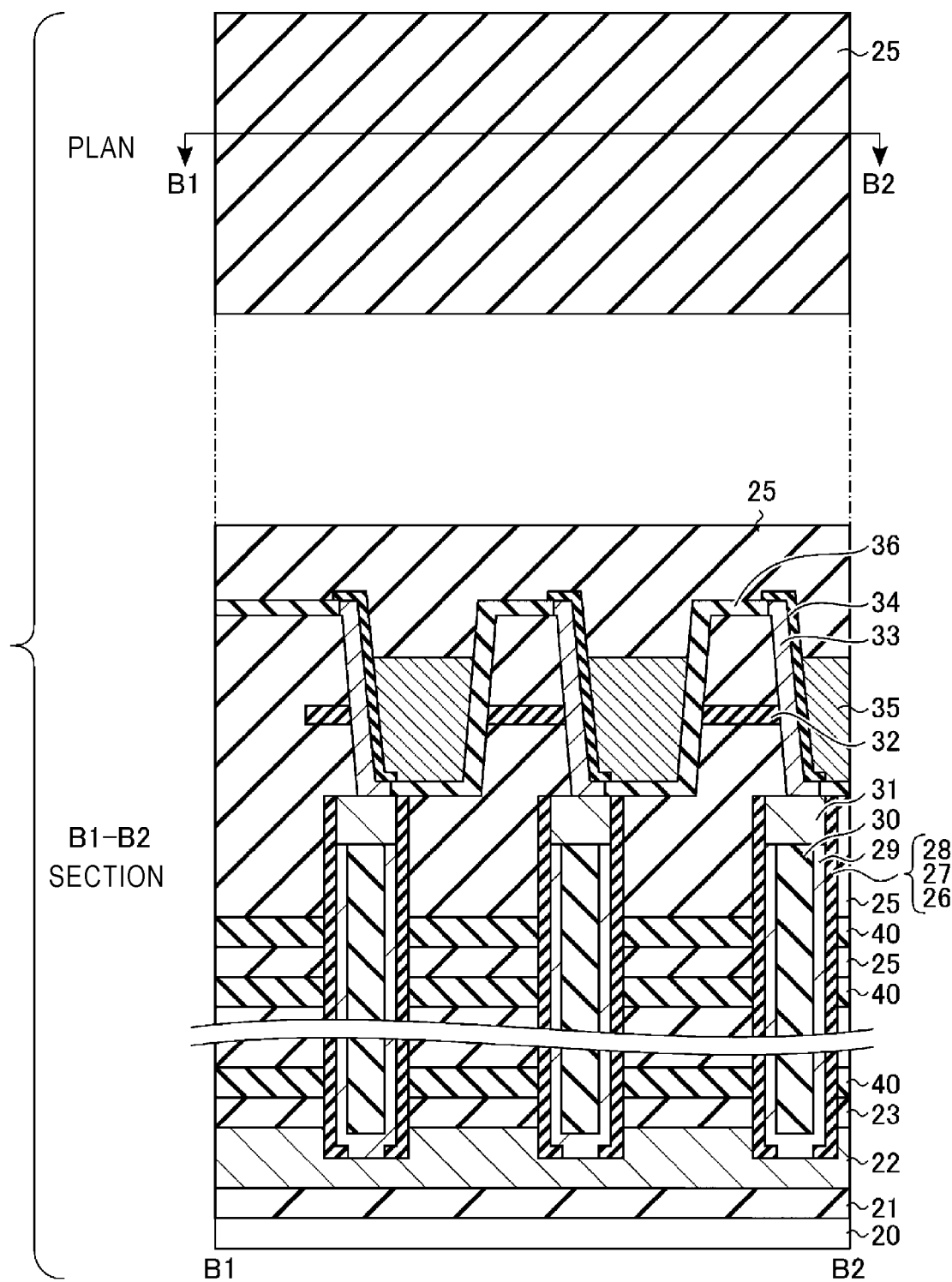

As illustrated in FIG. 11, the wiring layer 35 is formed. More specifically, for example, TiN and W are sequentially formed to fill the trench TR. Next, TiN and W on the surface and in the upper portion of the trench TR are removed, and the wiring layer 35 is formed.

Next, the insulating layer 25 is formed to cover the wiring layer 35. Then, the surface of the insulating layer 25 is flattened through, for example, a chemical mechanical polishing (CMP).

Figure 12:
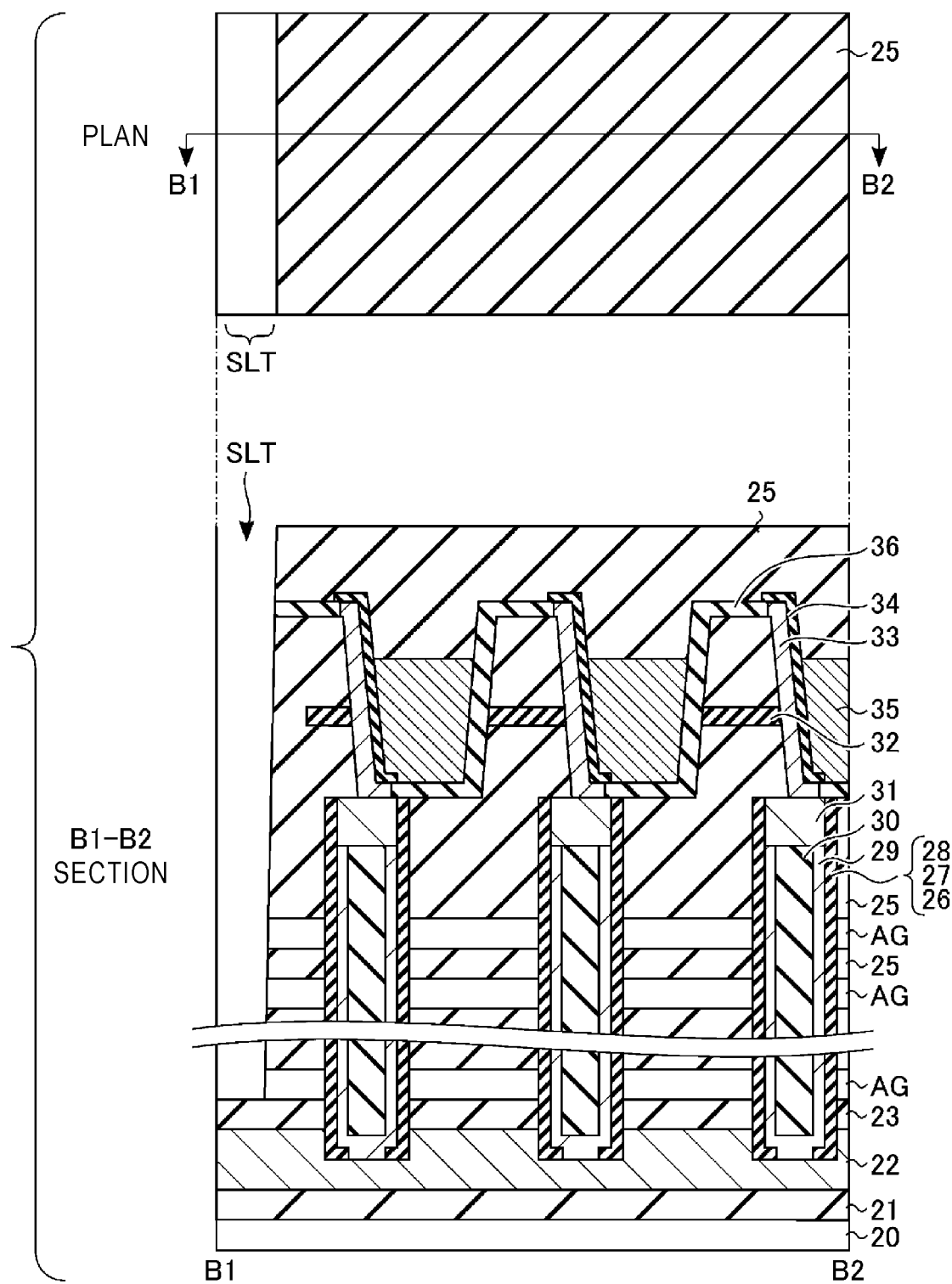

As illustrated in FIG. 12, replacement is performed. More specifically, first, the slit SLT whose bottom reaches the insulating layer 23 is processed. In this example, the insulating layer 32 is not exposed on the side surface of the slit SLT. Next, through wet etching, the sacrificial layers 40 are removed from the side surface of the slit SLT to form air gaps AG.

Figure 13:
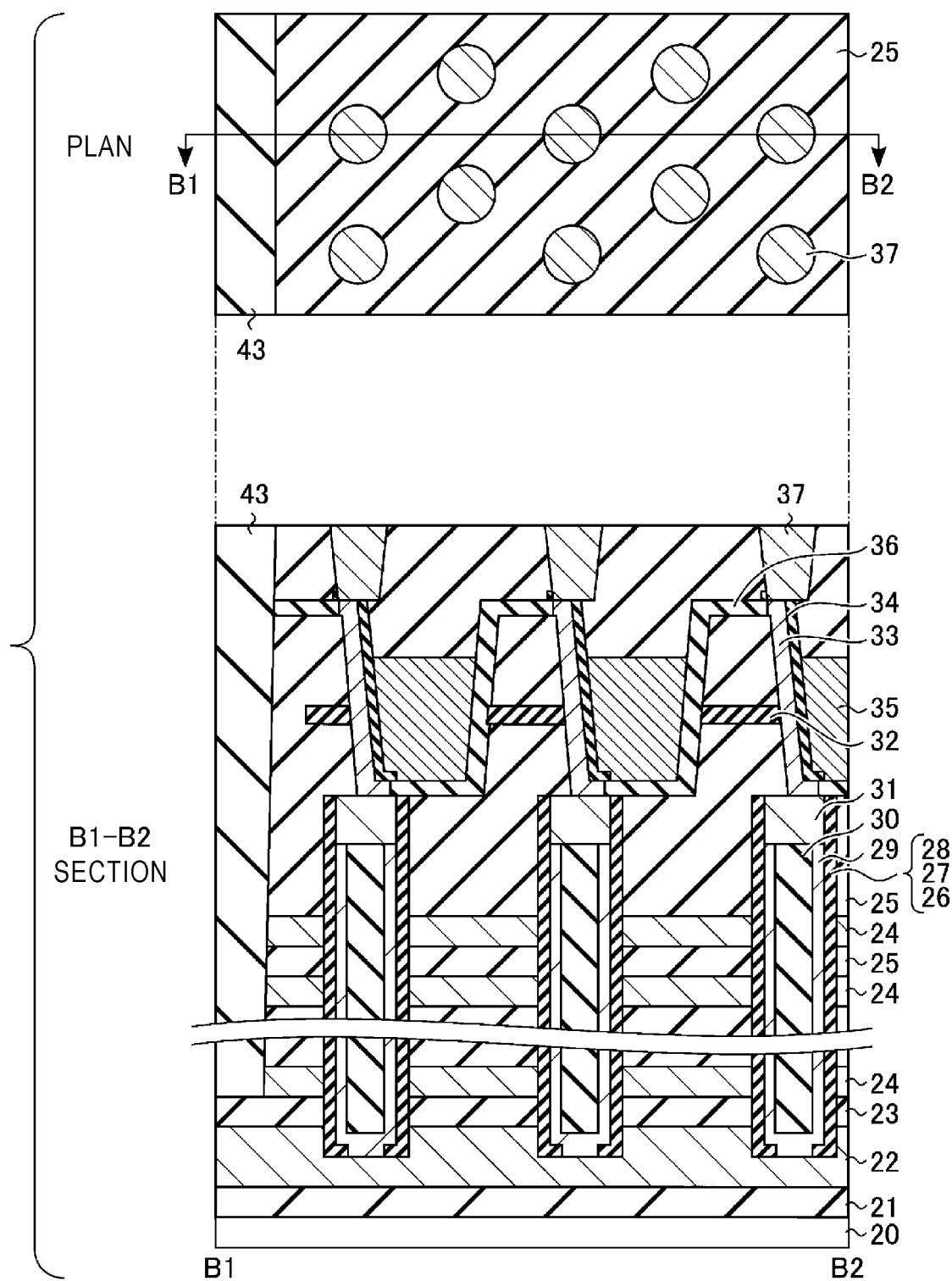

Next, as illustrated in FIG. 13, TiN and W are sequentially formed to fill the air gaps AG. Then, TiN and W formed within the slit SLT and on the uppermost insulating layer 25 are removed, and the wiring layers 24 are formed. Next, the slit SLT is filled with an insulating layer 43. Accordingly, the replacement process is completed.

Next, the conductor 37 whose bottom surface is in contact with the semiconductor layer 33 is formed.

Figure 14:
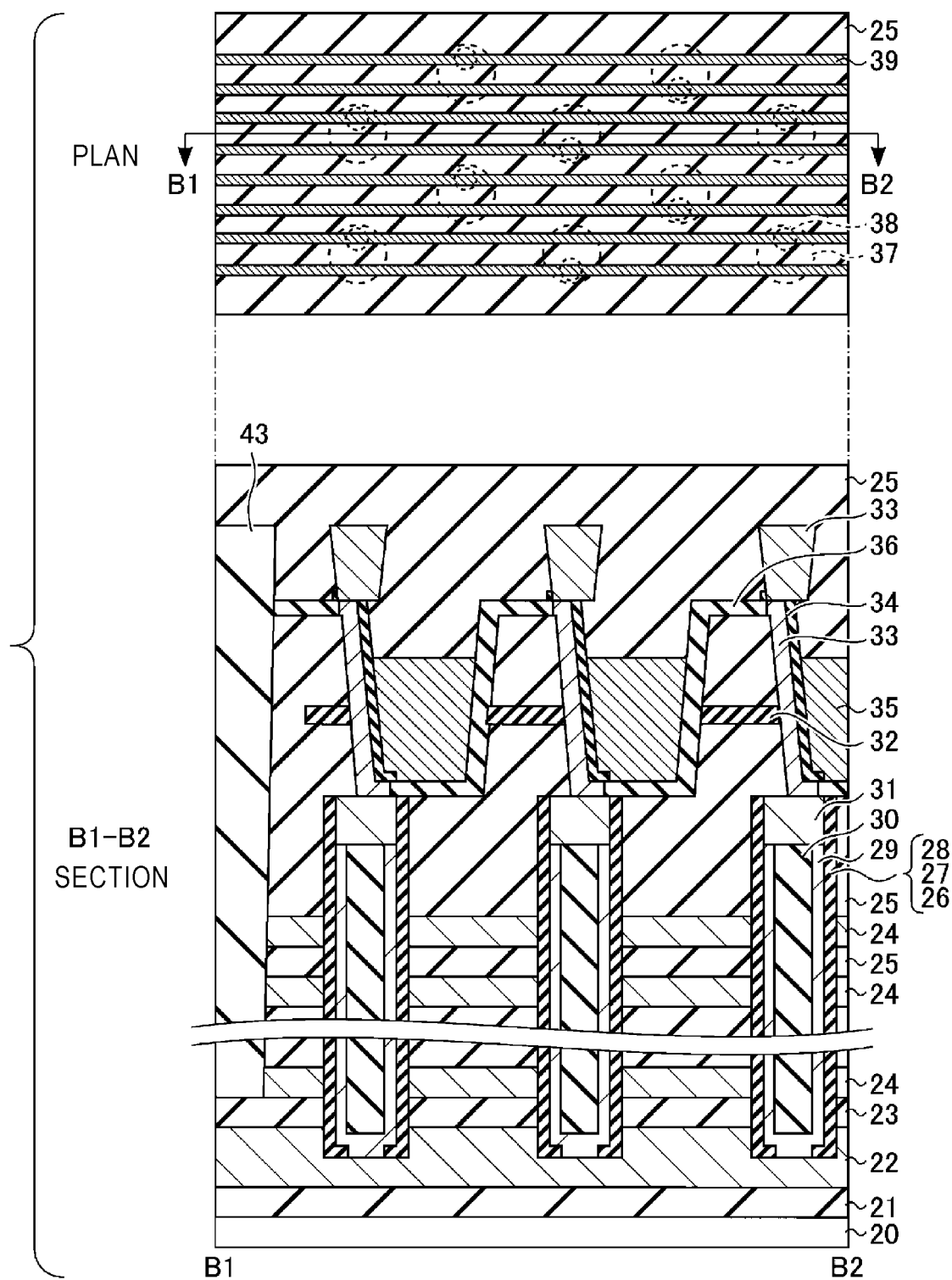

As illustrated in FIG. 14, after the insulating layer 25 is formed, the conductor 38 and the wiring layer 39 are formed.

1.3 Effects

The configuration according to the first embodiment may provide a semiconductor storage device in which an increase of a chip area may be prevented. This effect will be described.

For example, when a select transistor ST1 whose semiconductor layer has a cylindrical shape similarly to the memory pillar MP is formed on the memory pillar MP, it is necessary to provide a select gate line SGD so as to surround the cylindrical select transistor ST1 similarly to a word line WL. Unlike the word line WL, the select gate line SGD must be separated for each string unit SU. Thus, typically an isolation region for the select gate line SGD will be required, and therefore the occupied area of the memory cell array 10 may be increased.

However, in the configuration according to the embodiment, the select gate line SGD may be formed to pass above a part of a region of the memory pillar MP. The select transistor ST1 along the side surface and the bottom surface of the select gate line SGD may be formed on the memory pillar MP. Accordingly, the isolation region of a select gate line SGD is unnecessary and may be omitted, and therefore there is no need to increase chip area.

Furthermore, in the configuration according to the embodiment, the semiconductor layer 33 and the insulating layer 34 (also referred to as a gate insulating film) of the select transistor ST1 may be formed in a crank shape along the side surface and the bottom surface of the select gate line SGD. Accordingly, a channel region may be formed along the crank shape at the connection between the select transistor ST1 and the memory pillar MP as well.

Figure 15:
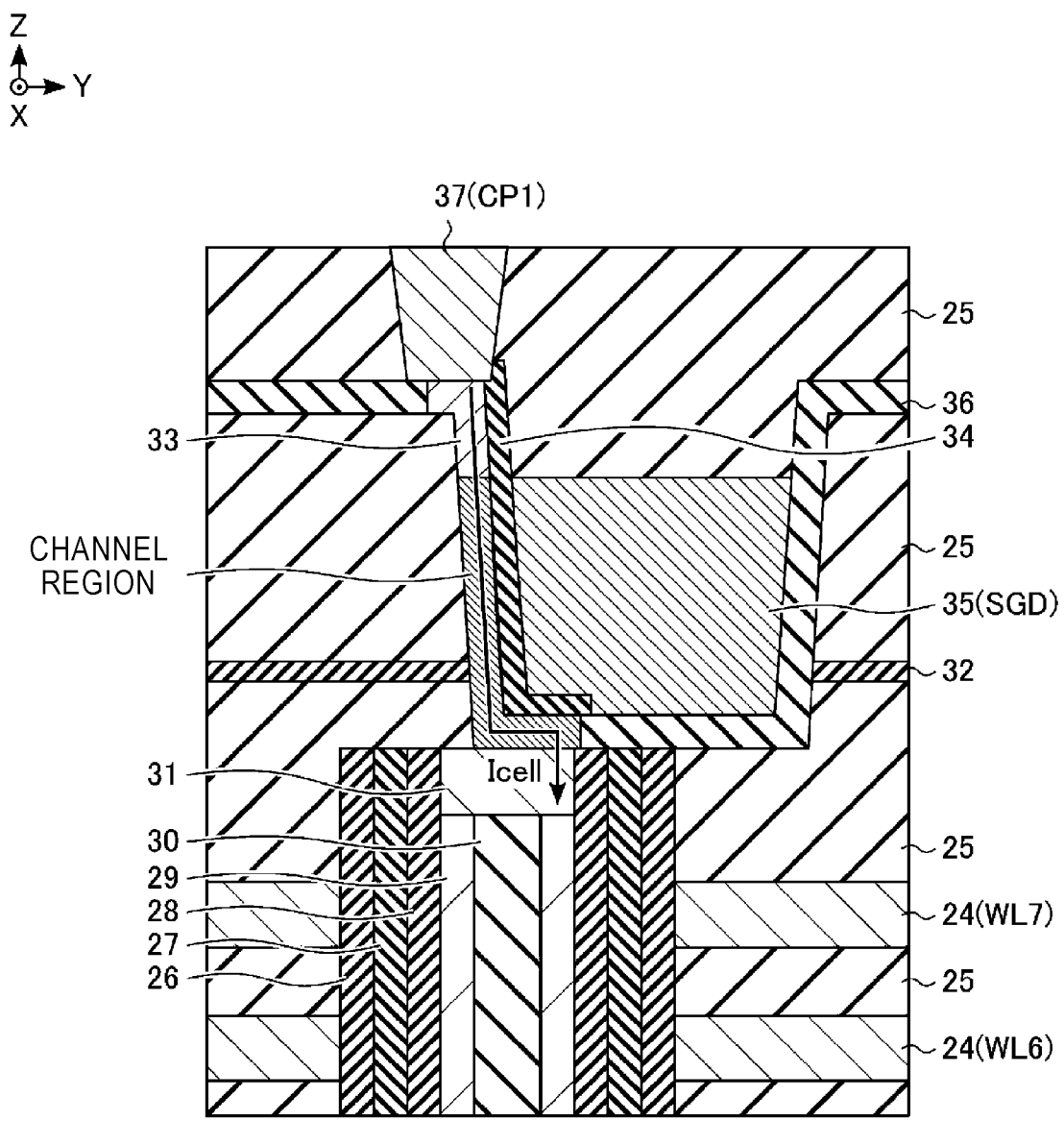
FIG. 15 is a view illustrating a current path of a select transistor ST1 in a semiconductor storage device according to the first embodiment.

The channel region will be described by using FIG. 15. FIG. 15 illustrates a section of the upper portion of the memory pillar MP and the select transistor ST1.

As illustrated in FIG. 15, when the select transistor ST1 is turned ON, the channel region is formed along the semiconductor layer 33 in the crank shape, in a region corresponding to the bottom surface and the side surface of the wiring layer 35. Thus, in the connection region between the semiconductor layer 33 and the memory pillar MP (more particularly the cap layer 31 in this example), an increase of a channel resistance may be prevented, and any reduction of cell current Icell flowing through the channel region of the memory pillar MP may be prevented. Therefore, it is possible to prevent a decrease in reading performance for the semiconductor storage device and to improve the reliability.

2. Second Embodiment

Next, a second embodiment will be described. In the second embodiment, descriptions will be made on a manufacturing method of the memory cell array 10 different from that in the first embodiment. Hereinafter, descriptions will be made focusing on differences between the second embodiment and the first embodiment.

2.1 Manufacturing Method of Memory Cell Array

A manufacturing method of the memory cell array 10 according to the second embodiment will be described by using FIG. 16 to FIG. 19. Each of FIG. 16 to FIG. 19 illustrates a plan view and a cross-section taken along the B1-B2 line (a B1-B2 section) of the memory cell array 10 in the manufacturing process.

Figure 16:
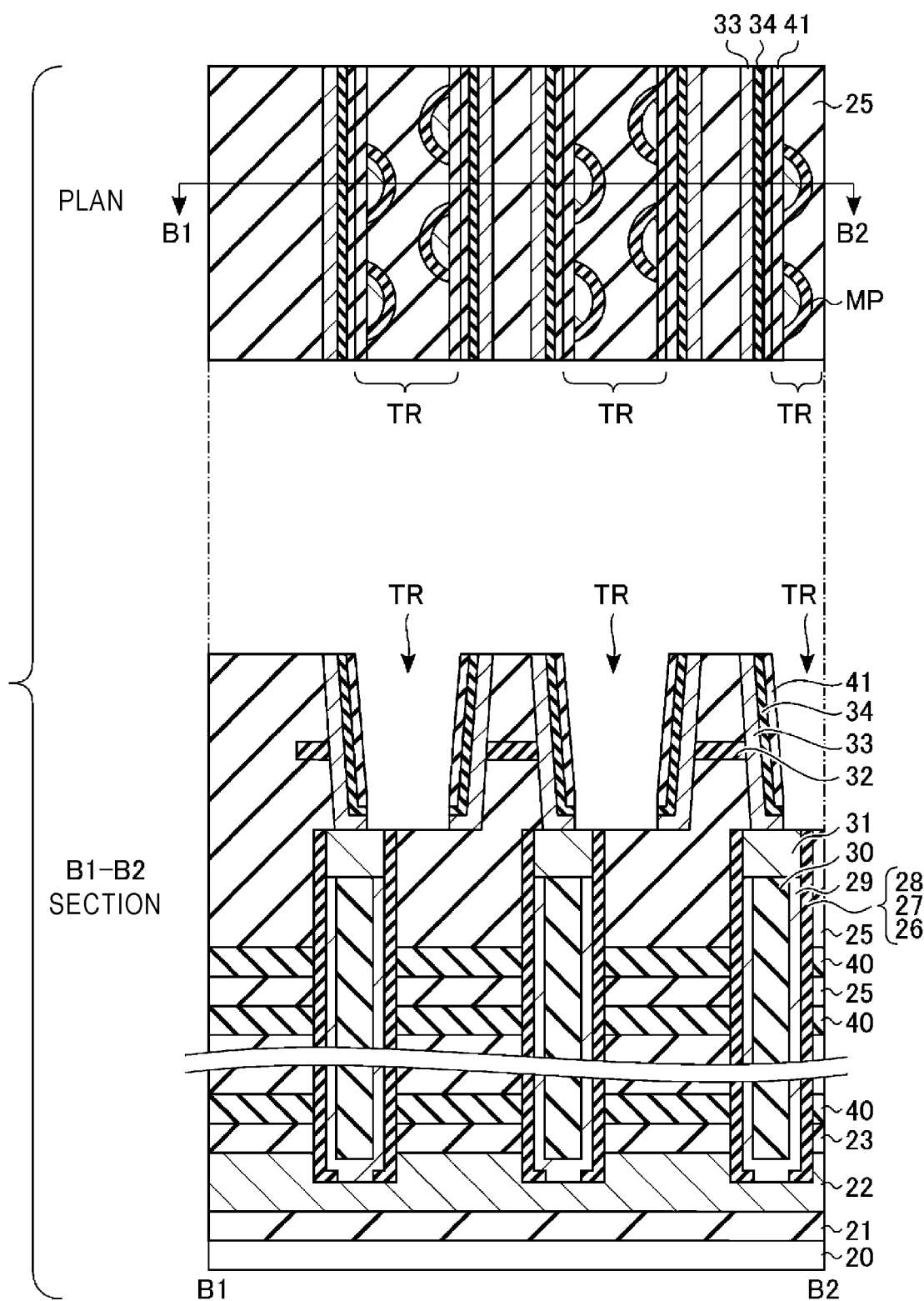
FIGS. 16-19 illustrate aspects of an example of a manufacturing process of a semiconductor storage device according to a second embodiment.

As illustrated in FIG. 16, as in FIG. 6 to FIG. 8 in the first embodiment, after the semiconductor layer 33, the insulating layer 34, and the insulating layer 41 are sequentially stacked, the semiconductor layer 33, the insulating layer 34, and the insulating layer 41 formed on the uppermost insulating layer 25 and a bottom portion of the trench TR are removed through, for example, a reactive ion etching (RIE). Here, the semiconductor layer 33, the insulating layer 34, and the insulating layer 41 on the side surface of the trench TR remain without being removed.

Figure 17:
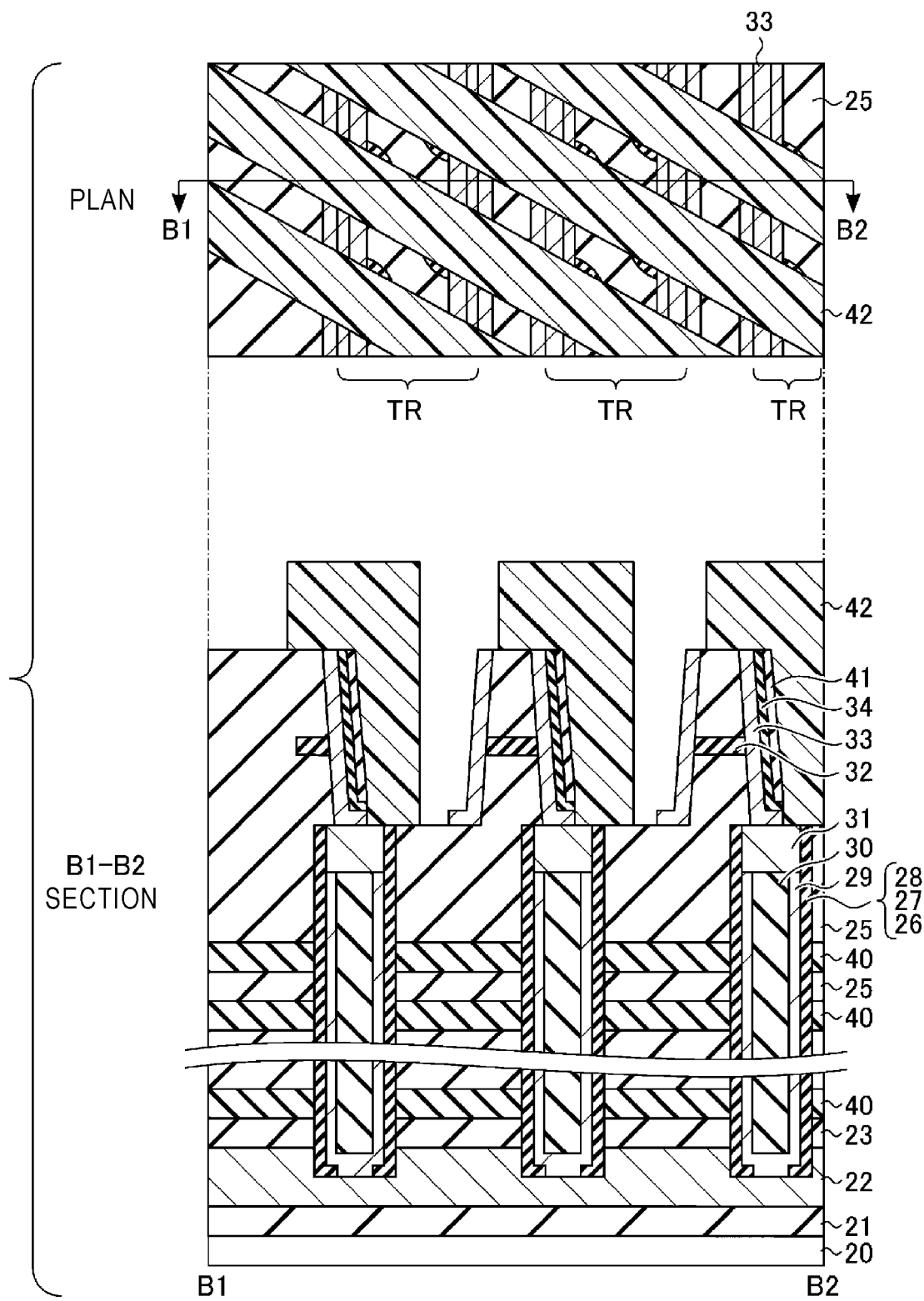

As illustrated in FIG. 17, a line pattern extending in a direction passing above the plurality of memory pillars MP arranged in staggered patterns is formed by using the resist 42. The resist 42 covers the semiconductor layer 33, the insulating layer 34, and the insulating layer 41 formed on the side surface of the trench TR above the memory pillar MP.

Next, for example, the insulating layer 34 and the insulating layer 41 in a region not covered with the resist 42 are removed through chemical dry etching (CDE).

Figure 18:
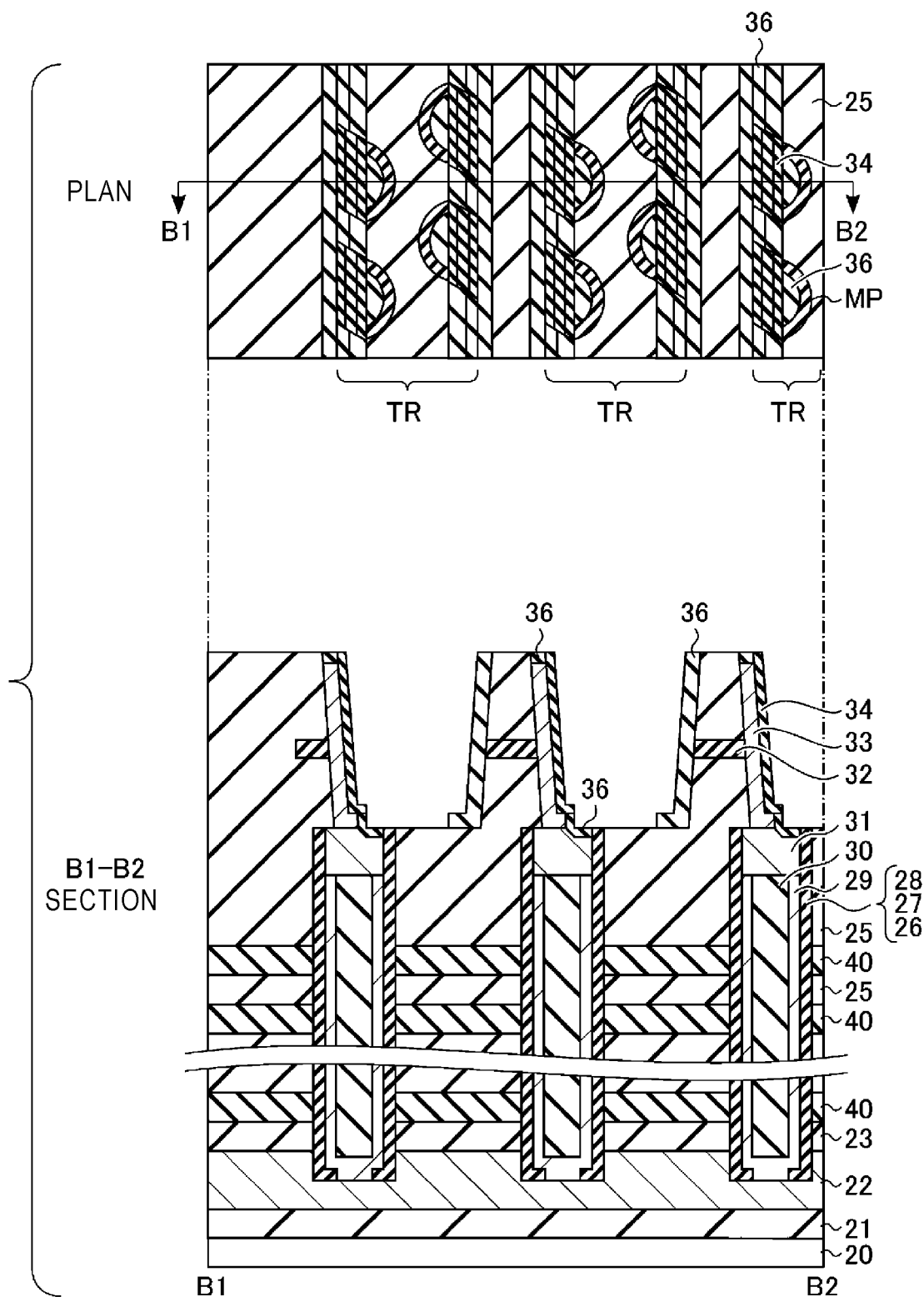

As illustrated in FIG. 18, after the resist 42 is removed, the semiconductor layer 33 is oxidized, and the insulating layer 36 is formed. Here, the semiconductor layer 33 in a region having a surface covered with the insulating layers 34 and 41 is not oxidized. An end region of the semiconductor layer 33 having a surface covered with the insulating layer 34 and the insulating layer 41 may be oxidized in some examples.

Next, the insulating layer 41 is removed by, for example, wet etching.

Figure 19:
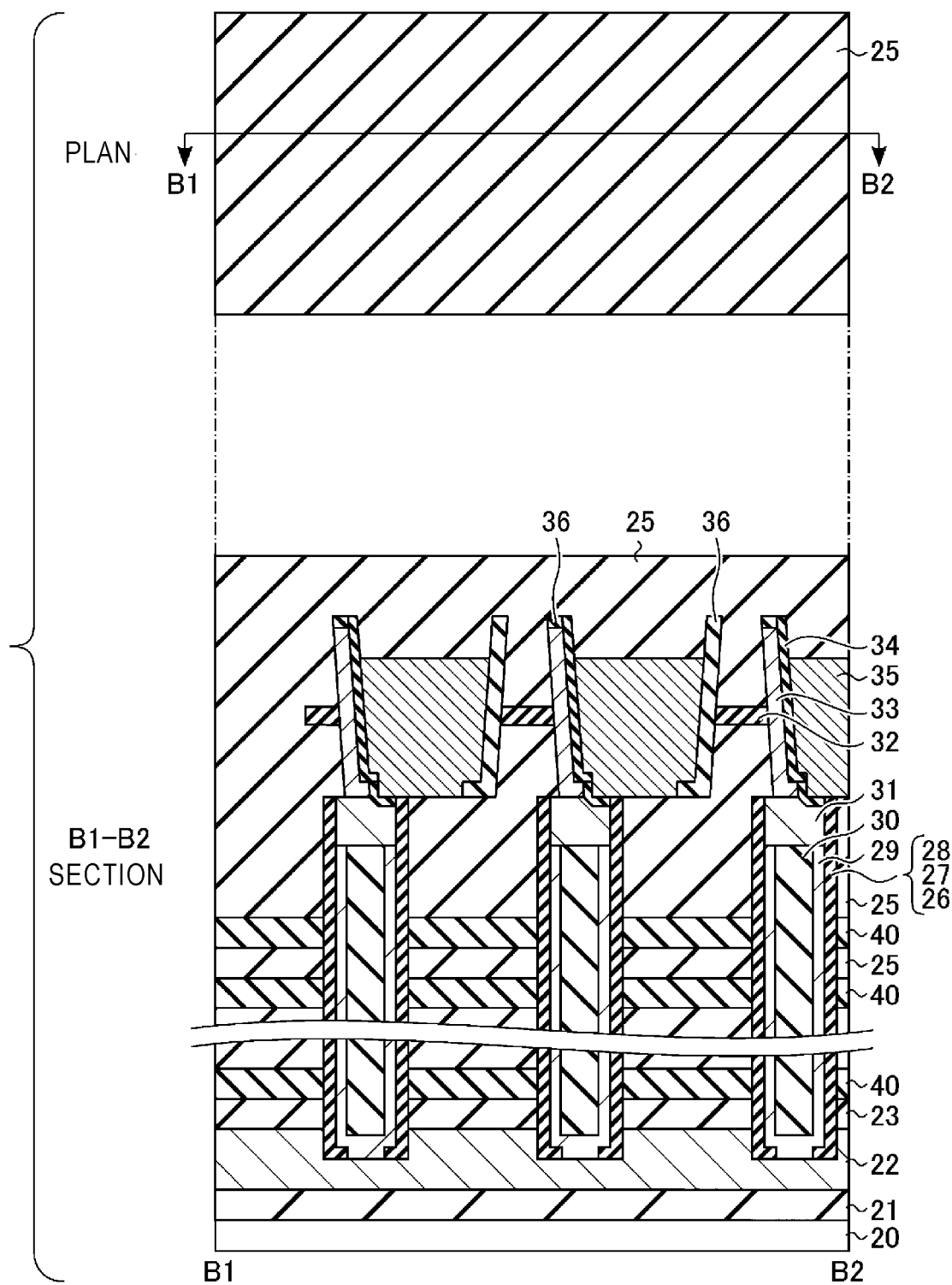

As illustrated in FIG. 19, as in FIG. 11 in the first embodiment, after the wiring layer 35 is formed, the insulating layer 25 is formed. Subsequent steps are the same as those in FIG. 12 to FIG. 14 in the first embodiment.

2.2 Effect by Embodiment

By the configuration according to the embodiment, the same effect as that in the first embodiment is obtained.

3. Third Embodiment

Next, a third embodiment will be described. In the third embodiment, a configuration of the select transistor ST1 different from that in the first and second embodiments will be described. Hereinafter, descriptions will be made focusing on differences between the third and the first and second embodiments.

3.1 Planar Configuration of Memory Cell Array

Figure 20:
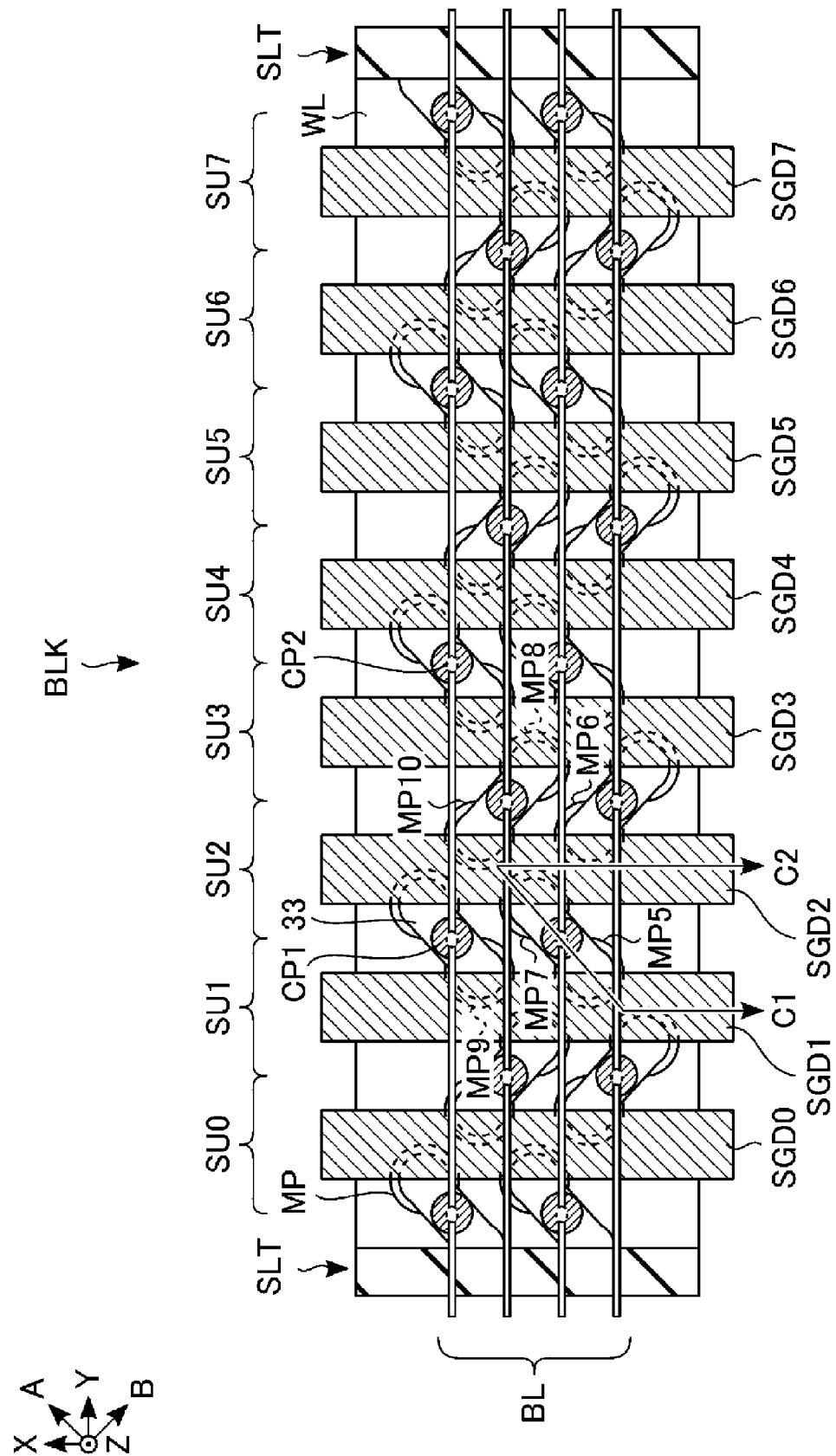
FIG. 20 is a plan view of a memory cell array in a semiconductor storage device according to a third embodiment.

First, a planar configuration of the memory cell array 10 according to the embodiment will be described by using FIG. 20. The example of FIG. 20 illustrates a plan view of a block BLK. In the embodiment, descriptions will be made for a case where each block BLK includes eight string units SU0 to SU7.

As illustrated in FIG. 20, for example, the string units SU0 to SU7 are arranged side by side in the Y direction, and the plurality of memory pillars MP is provided in each string unit SU.

For example, the plurality of memory pillars MP in each string unit SU is arranged in two rows of staggered pattern in the X direction. That is, in a block BLK, the memory pillars MP are arranged in 16 rows of a staggered pattern in the X direction.

More specifically, for example, a memory pillar MP5 of the string unit SU1, and a memory pillar MP6 of the string unit SU2 are arranged adjacent to each other in the Y direction. A memory pillar MP7 of the string unit SU2 and a memory pillar MP8 of the string unit SU3 are arranged adjacent to each other in the Y direction. A memory pillar MP9 of the string unit SU1 and a memory pillar MP10 of the string unit SU2 are arranged adjacent to each other in the Y direction. The memory pillar MP5 and the memory pillar MP9 are arranged along the X direction, and the memory pillar MP6 and the memory pillar MP10 are arranged along the X direction. In the X direction, the memory pillars MP7 and MP8 are arranged between the memory pillars MP5 (and MP6) and the memory pillars MP9 (and MP10). In the Y direction, the memory pillar MP7 is arranged between the memory pillars MP5 (and MP9) and the memory pillars MP6 (and MP10). In the Y direction, the memory pillars MP6 and MP10 are arranged between the memory pillar MP7 and the memory pillar MP8. In general, the arrangement of the memory pillars MP may be chosen freely.

A select transistor ST1 is provided on each memory pillar MP. The gates of the plurality of select transistors ST1 in each string unit SU are connected in common to the select gate line SGD. More specifically, for example, in the string unit SU2, a select gate line SGD2 extending in the X direction is provided between the select transistor ST1 provided on the memory pillar MP7 and the select transistors ST1 provided on the memory pillars MP6 (and MP10).

In the following description, for example, on the XY plane substantially in parallel to the semiconductor substrate, a direction connecting the center of the memory pillar MP5 to the center of the memory pillar MP7 is referred to as an A direction, and a direction connecting the center of the memory pillar MP10 to the center of the memory pillar MP8 is referred to as a B direction. That is, the A direction is substantially parallel to the semiconductor substrate and corresponds to a direction different from the X direction and the Y direction. The B direction is substantially parallel to the semiconductor substrate and corresponds to a direction intersecting the A direction.

In the embodiment, in two adjacent string units SU, the select transistors ST1 of two memory pillars MP adjacent to each other in the A direction or the B direction are connected in common to one bit line BL via the contact plugs CP1 and CP2. That is, the two select transistors ST1 provided between the two select gate lines SGD and adjacent to each other in the A direction or the B direction are connected in common to one contact plug CP1.

More specifically, for example, the semiconductor layer 33 of the memory pillar MP5 of the string unit SU1, and the semiconductor layer 33 of the memory pillar MP7 of the string unit SU2 adjacent thereto in the A direction are connected to one contact plug CP1. Similarly, for example, the semiconductor layer 33 of the memory pillar MP10 of the string unit SU2, and the semiconductor layer 33 of the memory pillar MP8 of the string unit SU3 adjacent thereto in the B direction are connected to one contact plug CP1.

The contact plug CP2 is provided on the contact plug CP1. The contact plug CP2 connects one of the bit lines BL extending in the Y direction to the contact plug CP1.

3.2 Cross-Sectional Configuration of Memory Cell Array

Figure 21:
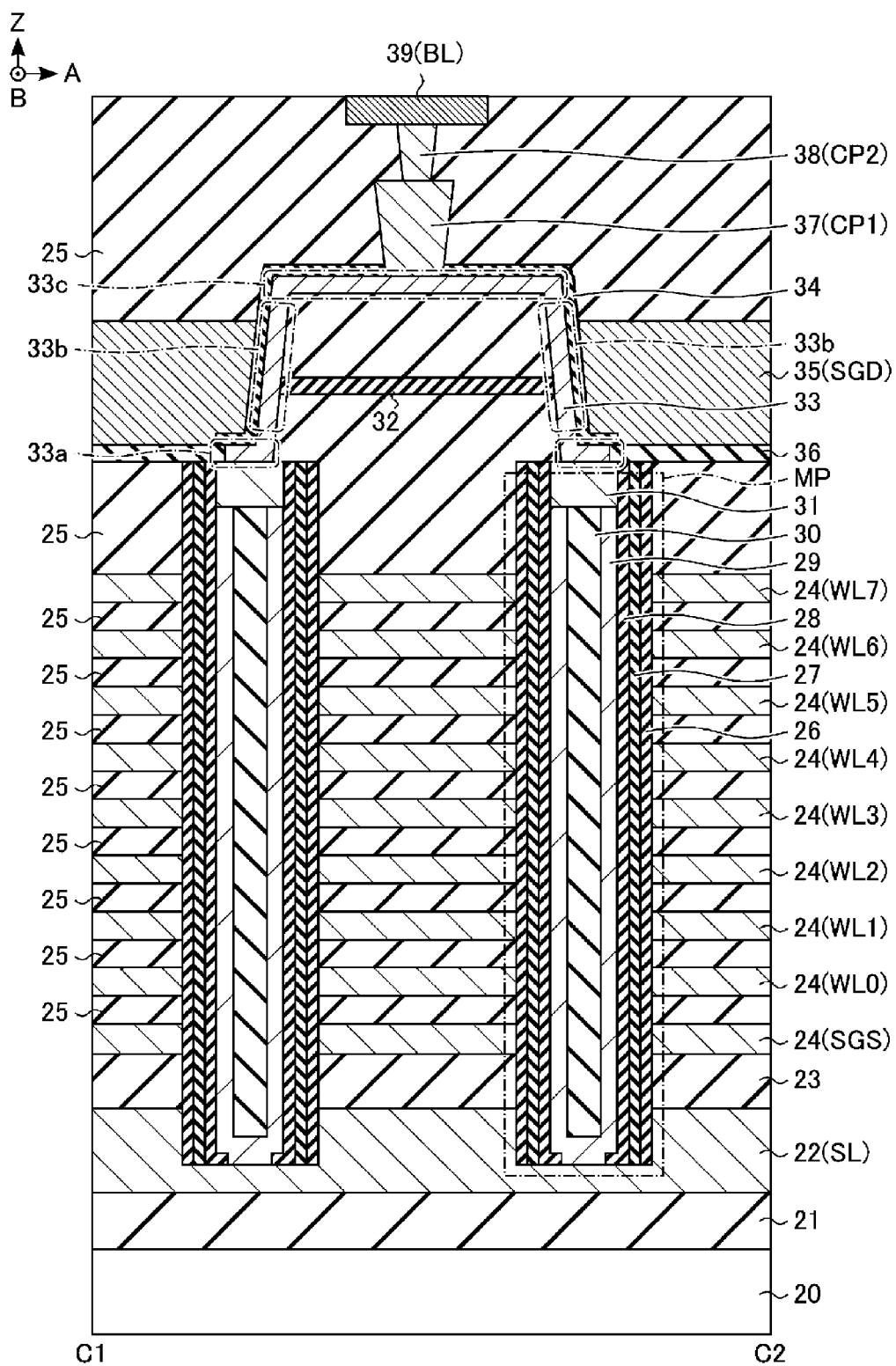
FIG. 21 is a cross-sectional view of the memory cell array in the semiconductor storage device according to the third embodiment.

Next, an example of a cross-sectional configuration of the memory cell array 10 will be described by using FIG. 21. FIG. 21 is a cross-sectional view taken along the C1-C2 line of FIG. 20.

As illustrated in FIG. 21, the wiring layer 35 extending in the X direction is formed above the memory pillar MP. The semiconductor layer 33 and the insulating layer 34 having a crank shape are provided between the memory pillar MP and the wiring layer 35, and in a part of a region between top sides of two adjacent trenches TR.

More specifically, the semiconductor layer 33 includes the semiconductor layers 33a to 33c. The semiconductor layer 33a and the semiconductor layer 33b are disposed on each memory pillar MP. Then, the semiconductor layer 33c extending in the A direction (or the B direction) is in contact with upper surfaces of two semiconductor layers 33b. That is, two adjacent select transistors ST1 are connected by one semiconductor layer 33.

Then, the conductor 37 is formed on the semiconductor layer 33 (the semiconductor layer 33c) provided between the two trenches TR.

3.3 Arrangement of Select Transistor ST1 and Select Gate Line SGD

Figure 22:
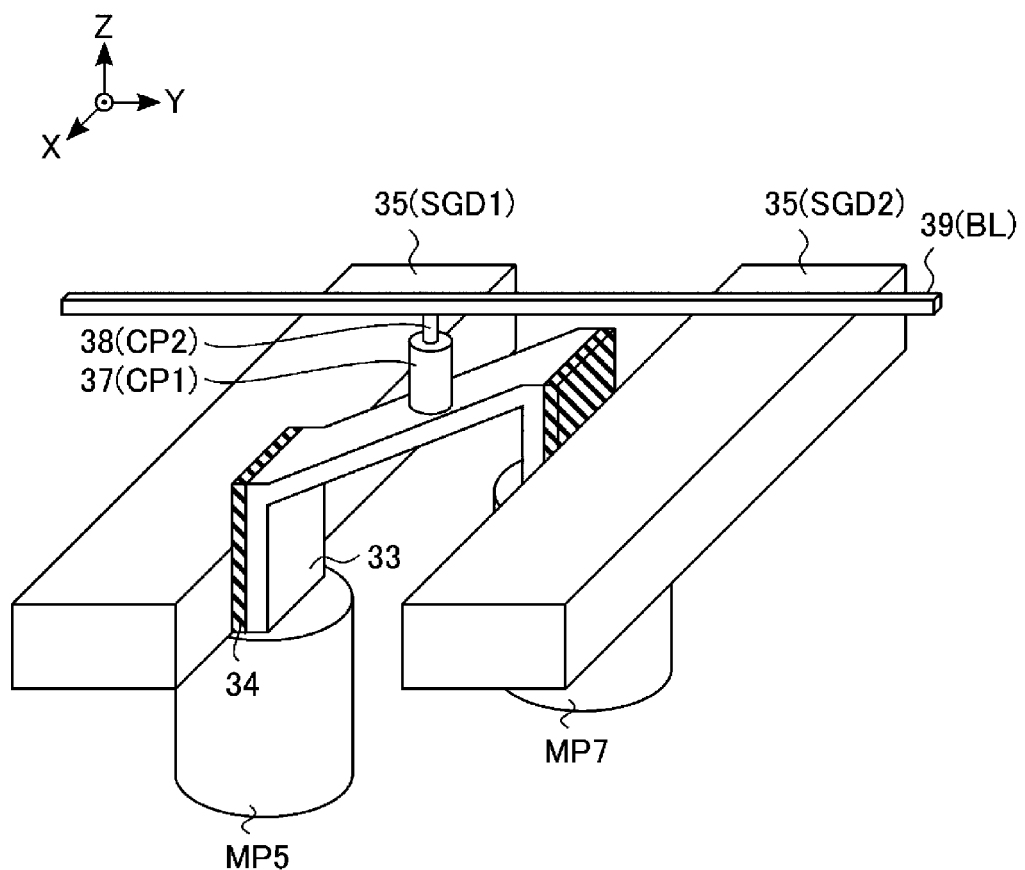
FIG. 22 is a perspective view of a select transistor ST1 in a memory cell array in a semiconductor storage device according to the third embodiment.

Next, an example of arrangement of the select transistor ST1 and the select gate line SGD will be described by using FIG. 22. FIG. 22 is a perspective view illustrating the arrangement of a top portion of the memory pillar MP, the select transistor ST1, the select gate line SGD, the contact plugs CP1 and CP2, and the bit line BL. In the example of FIG. 22, in order to simplify description, a part of the insulating layers is omitted. Also, the select transistor ST1 is somewhat simplified.

As illustrated in FIG. 22, for example, the two memory pillars MP5 and MP7 are arranged in staggered pattern in the X direction. The wiring layer 35 (the select gate line SGD1) extending in the X direction passes above a part of a region of the memory pillar MP5. Similarly, the wiring layer 35 extending in the X direction (the select gate line SGD2) passes above a part of a region of the memory pillar MP7. The wiring layer 35 is not provided between the memory pillar MP5 and the memory pillar MP7. The semiconductor layer 33 and the insulating layer 34 are provided on the memory pillars MP5 and MP7, and between the memory pillar MP5 and the memory pillar MP7. The semiconductor layer 33 is connected to the wiring layer 39 via the conductors 37 and 38. Since the example of FIG. 22 illustrates a connection between the semiconductor layer 33 and the conductor 37, the insulating layer 34 provided between the memory pillar MP5 and the memory pillar MP7 is omitted.

3.4 Manufacturing Method of Memory Cell Array

A manufacturing method of the memory cell array 10 according to the third embodiment will be described by using FIG. 23 to FIG. 28. Each of FIG. 23 to FIG. 28 illustrates a plan view and a cross-section taken along the B1-B2 line (a B1-B2 section) of the memory cell array 10 during stages of the manufacturing process.

Figure 23:
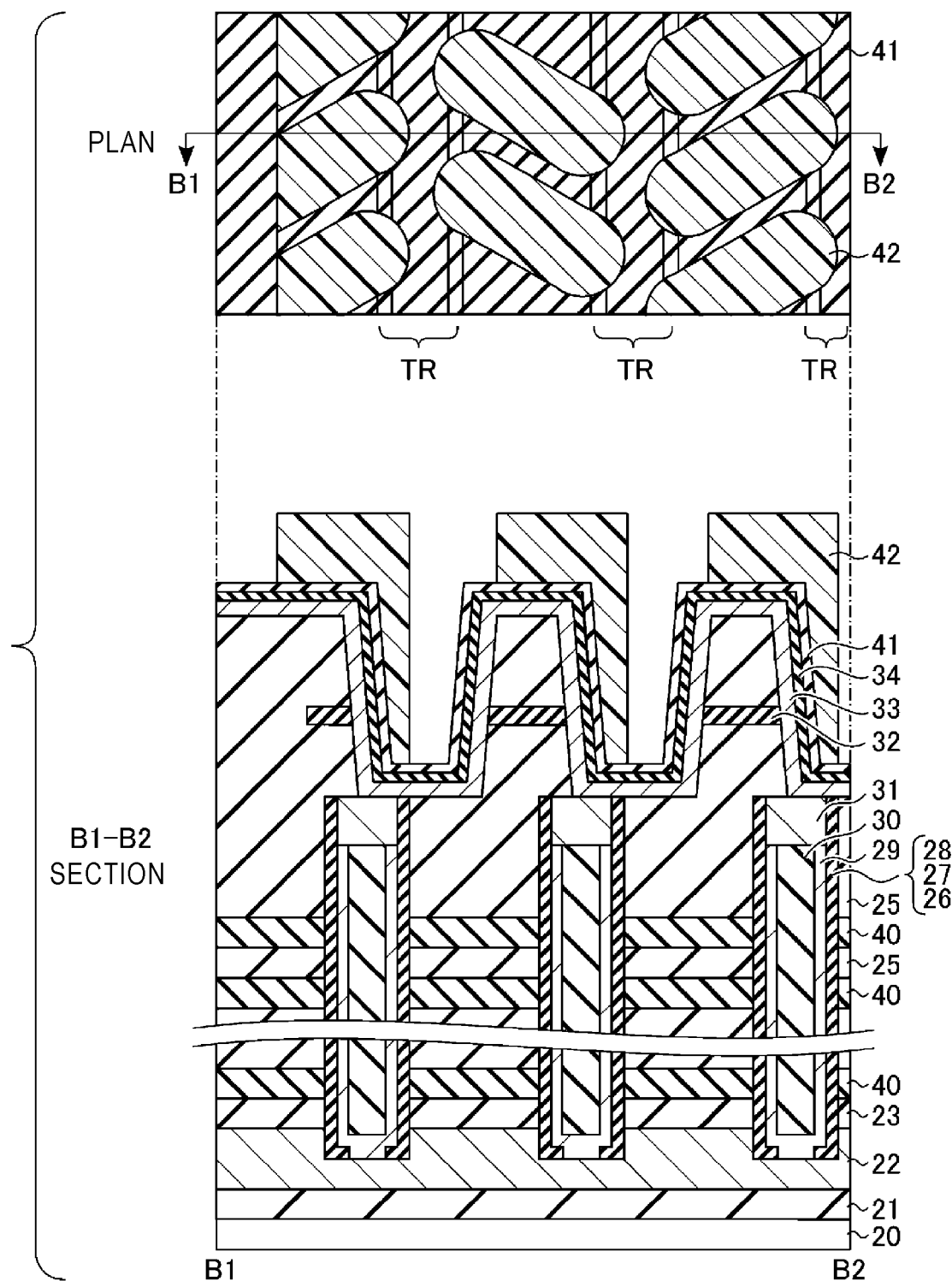
FIGS. 23-28 illustrate aspects of an example of a manufacturing process of a semiconductor storage device according to the third embodiment.

As illustrated in FIG. 23, as in FIG. 6 to FIG. 8 in the first embodiment, after the semiconductor layer 33, the insulating layer 34, and the insulating layer 41 are sequentially stacked, a mask pattern covering topsides of two adjacent memory pillars MP is formed between two trenches TR.

Figure 24:
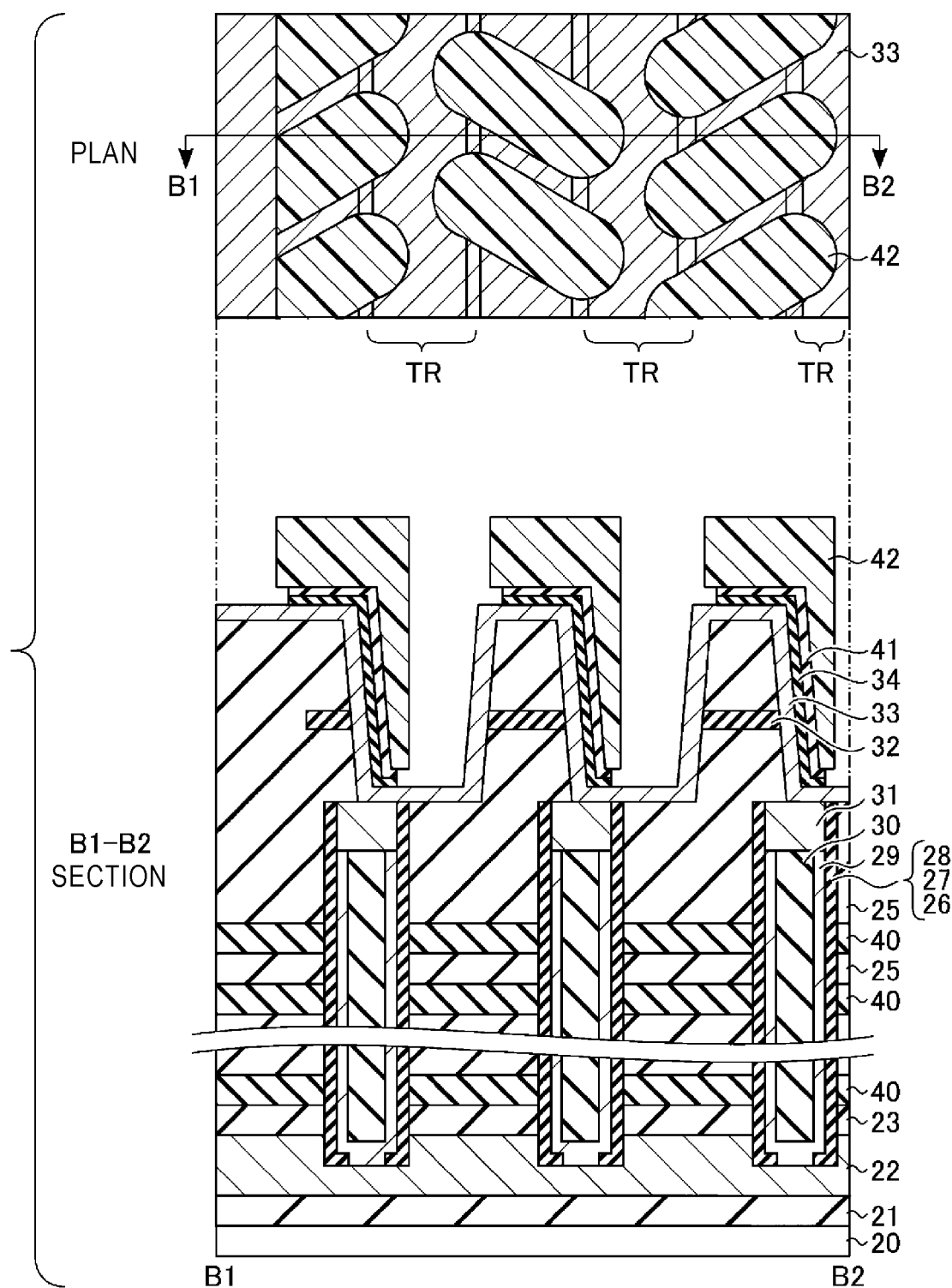

As illustrated in FIG. 24, for example, the insulating layer 34 and the insulating layer 41 in a region not covered with the resist 42 are removed through chemical dry etching (CDE).

Figure 25:
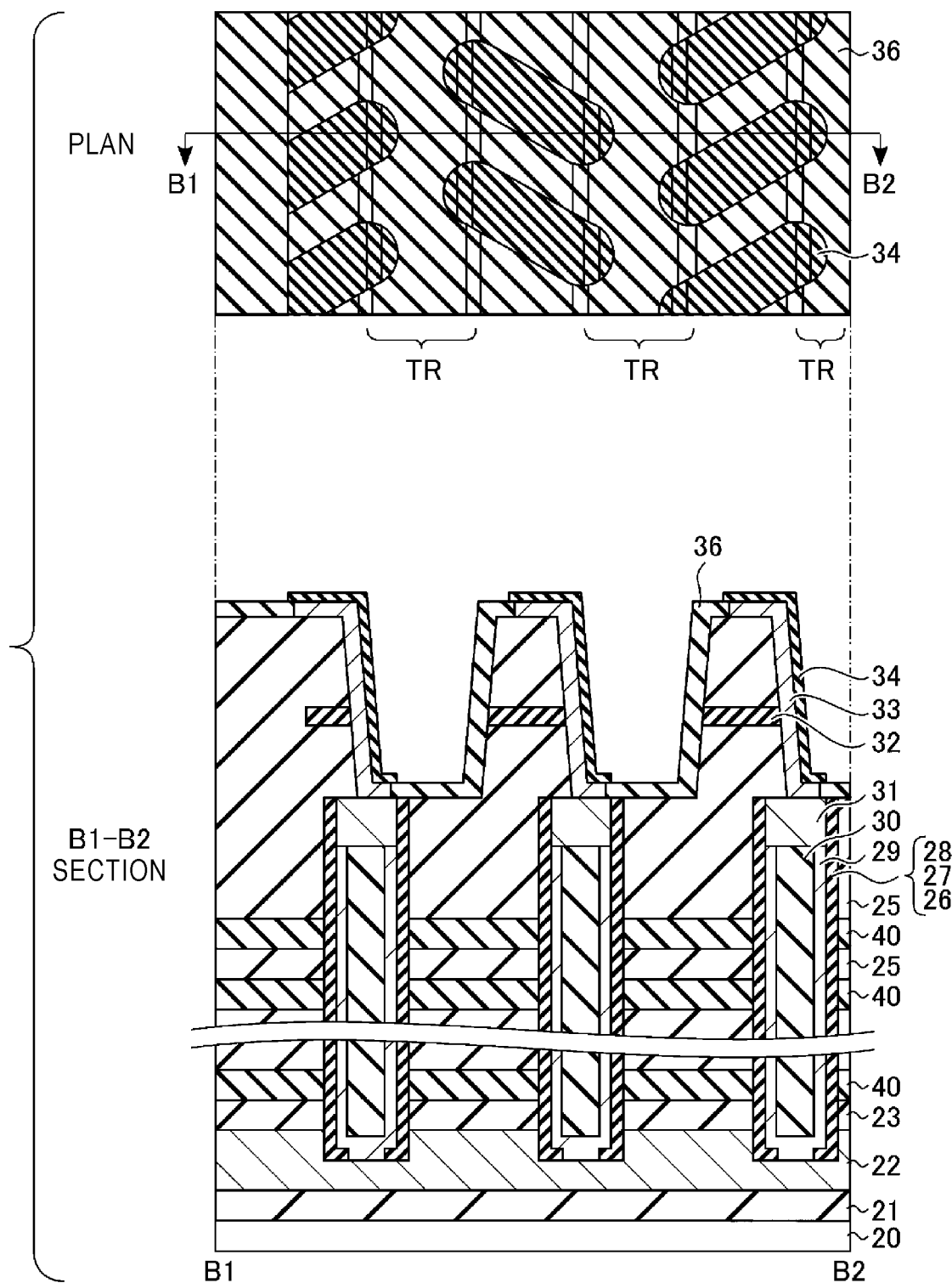

As illustrated in FIG. 25, after the resist 42 is removed, the semiconductor layer 33 is oxidized, and the insulating layer 36 is formed. The semiconductor layer 33 in a region having a surface covered with the insulating layers 34 and 41 is not oxidized. An end region of the semiconductor layer 33 having a surface covered with the insulating layer 34 and the insulating layer 41 may be oxidized in some examples.

Next, the insulating layer 41 is removed by, for example, wet etching.

Figure 26:
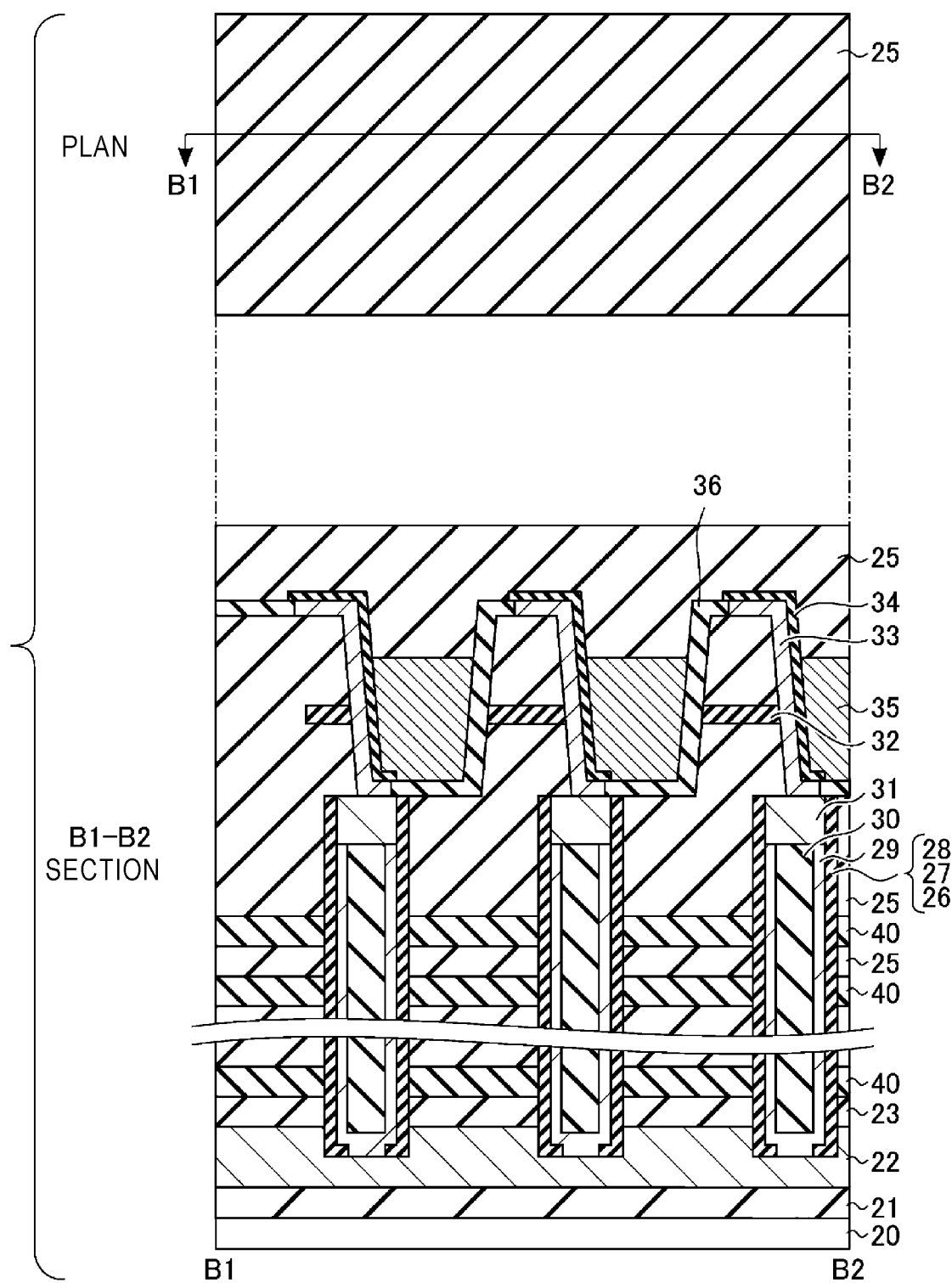

As illustrated in FIG. 26, as in FIG. 11 in the first embodiment, after the wiring layer 35 is formed, the insulating layer 25 is formed.

Figure 27:
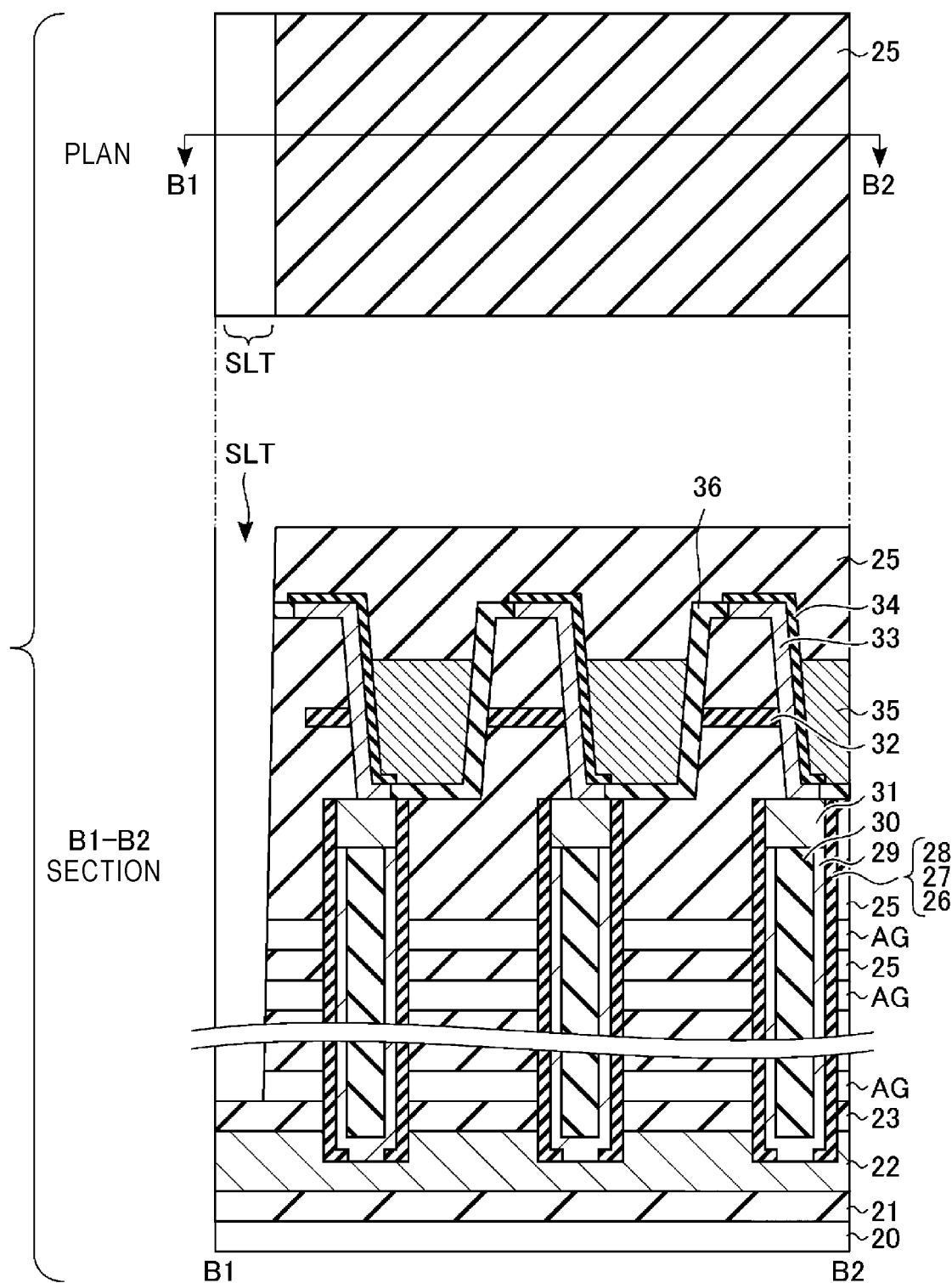

As illustrated in FIG. 27, after the slit SLT is processed, the sacrificial layers 40 are removed from the side surface of the slit SLT to form air gaps AG through wet etching.

Figure 28:
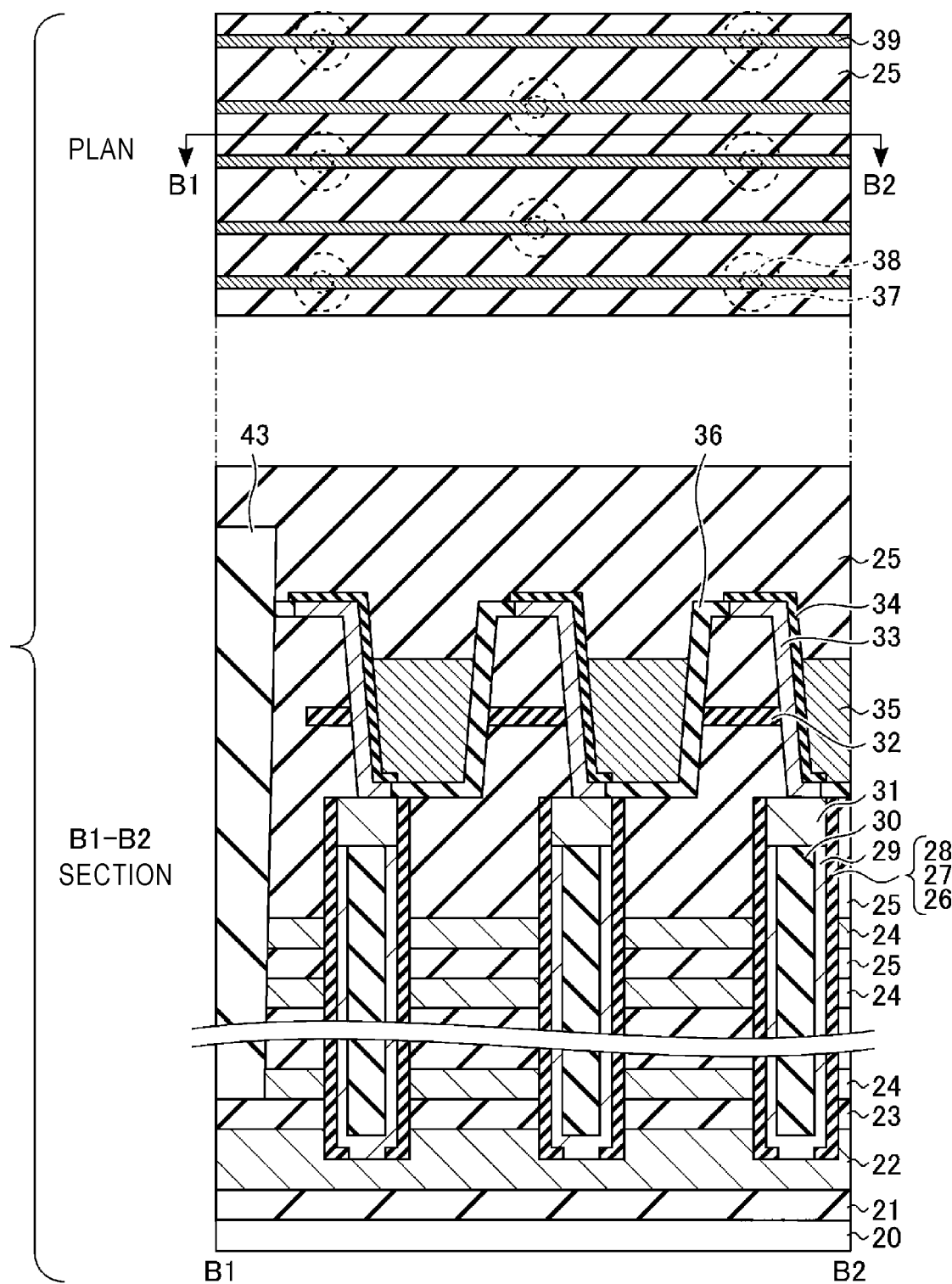

As illustrated in FIG. 28, TiN and W are then formed to fill the air gaps. Then, TiN and W formed in the slit SLT and on the uppermost insulating layer 25 are removed, and the wiring layers 24 are formed. Next, the slit SLT is filled with the insulating layer 43.

Next, the conductor 37 whose bottom surface is in contact with the semiconductor layer 33 is formed.

Next, after the insulating layer 25 is formed, the conductor 38 and the wiring layer 39 are formed.

3.5 Effects in Third Embodiment

By the configuration according to the third embodiment, the same effect as that in the first embodiment is obtained.

In the configuration according to the third embodiment, since the two adjacent memory pillars MP are connected in common to one contact plug CP1, it is possible to reduce the required number of bit lines BL, and thus to widen a wiring interval between adjacent bit lines BL. Thus, a wiring width of the bit lines BL may be increased and an increase in wiring resistance may be prevented. Furthermore, the possibility of formation failure of the bit lines BL, which is increased by miniaturization, may be reduced, and thus the reliability of the semiconductor storage device may be improved.

4. Fourth Embodiment

Next, a fourth embodiment will be described. In the fourth embodiment, a layout of the memory cell array 10 different from that in the third embodiment will be described. Hereinafter, descriptions will be made focusing on differences between the fourth embodiment and the third embodiment.

4.1 Planar Configuration of Memory Cell Array

Figure 29:
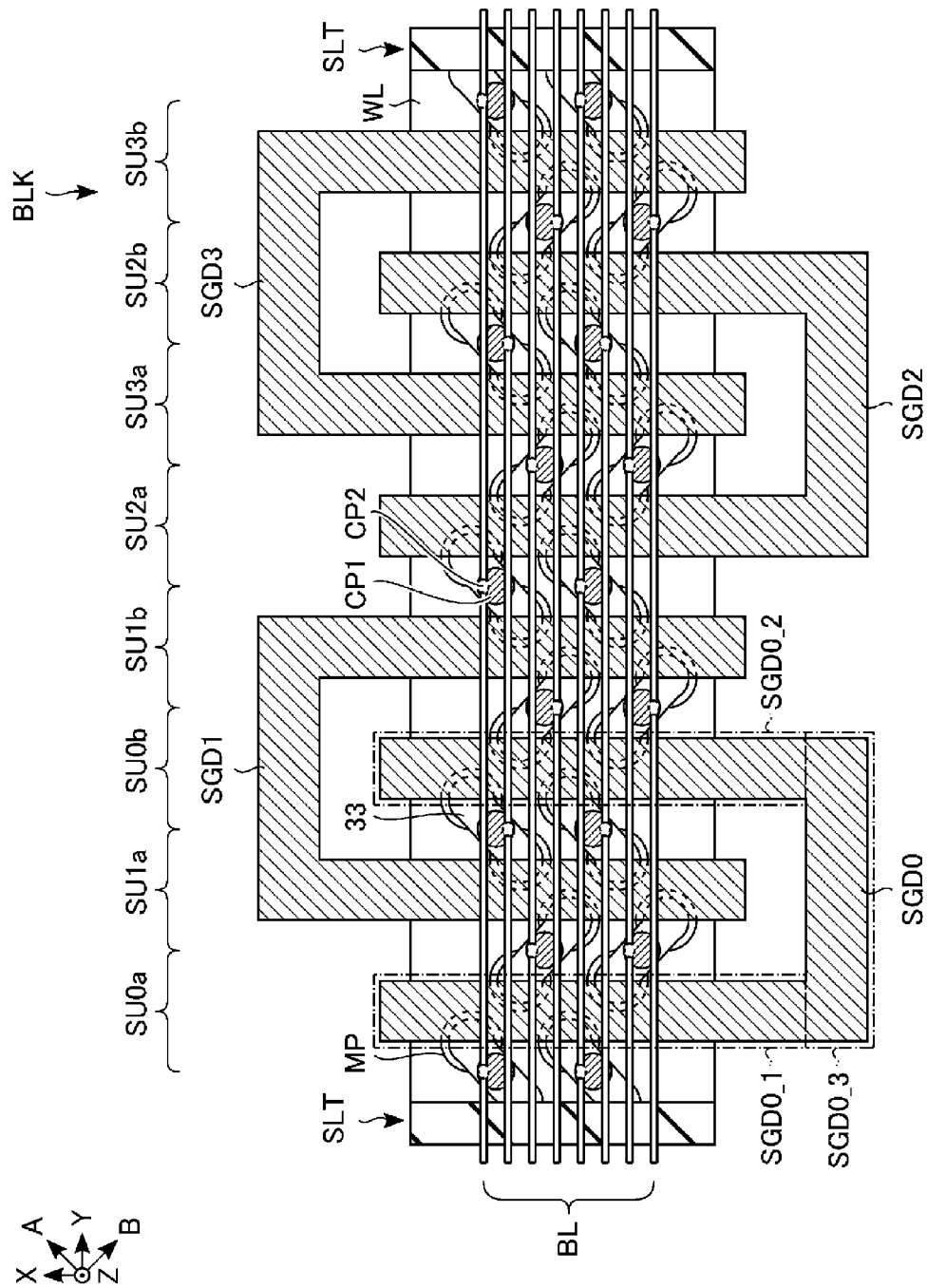
FIG. 29 is a plan view of a memory cell array in a semiconductor storage device according to a fourth embodiment.

First, a planar configuration of the memory cell array 10 according to the embodiment will be described by using FIG. 29. The example of FIG. 29 illustrates a plan view of a block BLK. In the embodiment, descriptions will be made for a case where each block BLK includes four string units SU0 to SU3.

As illustrated in FIG. 29, a string unit SU that is divided into two areas is provided. The divided areas of two string units SU are alternately arranged in the Y direction.

More specifically, for example, the string unit SU0 includes string units SU0a and SU0b. The string unit SU1 includes string units SU1a and SU1b. The string unit SU2 includes string units SU2a and SU2b. The string unit SU3 includes string units SU3a and SU3b. For example, along the Y direction, the string unit SU0a, the string unit SU1a, the string unit SU0b, and the string unit SU1b are sequentially arranged. Similarly, along the Y direction, the string unit SU2a, the string unit SU3a, the string unit SU2b, and the string unit SU3b are sequentially arranged.

For example, the plurality of memory pillars MP in each string unit SU (SU0a, SU0b, SU1a, SU1b, SU2a, SU2b, SU3a, and SU3b) is arranged in two rows of staggered pattern in the X direction. That is, in one block BLK, the memory pillars MP is arranged in 16 rows of a staggered pattern in the X direction. In general, the arrangement of the memory pillars MP may be chosen freely.

A select transistor ST1 is provided on each memory pillar MP. Then, the gates of the plurality of select transistors ST1 in each string unit SU are connected in common to the select gate line SGD.

In the example of FIG. 29, the select gate line SGD0 includes the select gate line SGD0_1 and the select gate line SGD0_2 extending in the X direction, and the select gate line SGD0_3 to which ends of the select gate line SGD0_1 and the select gate line SGD0_2 are connected. For example, the select gate line SGD0_1 corresponds to the plurality of select transistors ST1 of the string unit SU0a, and is disposed between the plurality of select transistors ST1 arranged in two rows of staggered pattern. For example, the select gate line SGD0_2 corresponds to the plurality of select transistors ST1 of the string unit SU0b, and is disposed between the plurality of select transistors ST1 arranged in two rows of staggered pattern. The same also applies to the other string units SU.

In this embodiment, as in the third embodiment, in two adjacent string units SU, the select transistors ST1 of two memory pillars MP adjacent to each other in the A direction or the B direction are connected in common to one contact plug CP1. That is, the memory pillars MP in one string unit SU (e.g., the string unit SU0) are connected to different contact plugs CP1, respectively.

The contact plug CP2 is provided on the contact plug CP1. Each contact plug CP2 connects one of the bit lines BL extending in the Y direction to the contact plug CP1. That is, the memory pillars MP in one string unit SU are connected to different bit lines, respectively, via the contact plugs CP1 and CP2.

4.2 Effects in Fourth Embodiment

By a configuration according to the fourth embodiment, the same effect as that in the first embodiment can be obtained.

In the configuration according to the fourth embodiment, since two bit lines BL are connected to one contact plug CP1, an increase of a wiring resistance of the bit lines BL may be avoided.

5. Fifth Embodiment

Next, a fifth embodiment will be described. In the fifth embodiment, descriptions will be made for a case where two select transistors ST1 are formed on a single memory pillar MP. Hereinafter, descriptions will be made focusing on differences between the fifth embodiment and the first to fourth embodiments.

5.1 Planar Configuration of Memory Cell Array

First, a planar configuration of the memory cell array 10 according to the embodiment will be described by using FIG. 30. The example of FIG. 30 illustrates a plan view of a block BLK.

Figure 30:
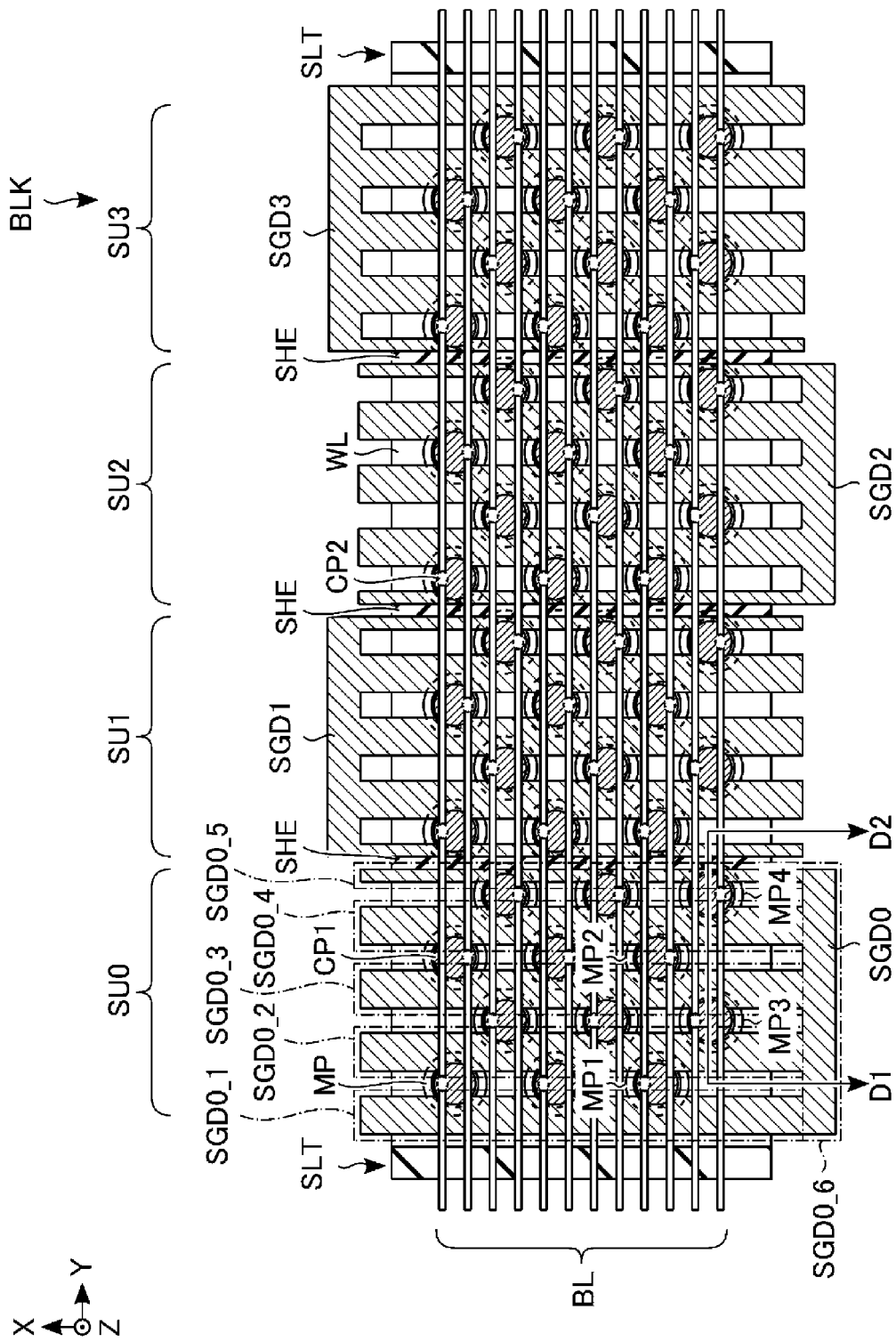
FIG. 30 is a plan view of a memory cell array in a semiconductor storage device according to a fifth embodiment.

As illustrated in FIG. 30, the string units SU0 to SU3 are arranged side by side in the Y direction, and the memory pillars MP are provided in each string unit SU.

For example, the memory pillars MP in each string unit SU are arranged in four rows of a staggered pattern in the X direction. That is, in a block BLK, the memory pillars MP are arranged in 16 rows of a staggered pattern in the X direction. More specifically, for example, in the string unit SU0, the memory pillar MP1 and the memory pillar MP2 are arranged adjacent to each other in the Y direction, and the memory pillar MP3 and the memory pillar MP4 are arranged adjacent to each other in the Y direction. Then, the memory pillar MP3 is arranged between the memory pillar MP1 and the memory pillar MP2 in the Y direction, and is arranged at a different position from the memory pillars MP1 and MP2 in the X direction. The memory pillar MP2 is arranged between the memory pillar MP3 and the memory pillar MP4 in the Y direction, and is arranged at a different position from the memory pillars MP3 and MP4 in the X direction. In general, the arrangement of the memory pillars MP may be chosen freely.

Two select transistors ST1 are provided on each memory pillar MP. Then, the gates of the plurality of select transistors ST1 in each string unit SU are connected in common to the select gate line SGD.

In the example of FIG. 30, the select gate line SGD0 includes select gate lines SGD0_1 to SGD0_5 extending in the X direction, and a select gate line SGD0_6 to which ends of the select gate lines SGD0_1 to SGD0_5 are connected. For example, in the string unit SU0, two select transistors ST1 of the memory pillar MP1 are provided between the select gate line SGD0_1 and the select gate line SGD0_2. Two select transistors ST1 of the memory pillar MP3 are provided between the select gate line SGD0_2 and the select gate line SGD0_3. Two select transistors ST1 of the memory pillar MP2 are provided between the select gate line SGD0_3 and the select gate line SGD0_4. Two select transistors ST1 of the memory pillar MP4 are provided between the select gate line SGD0_4 and the select gate line SGD0_5. The same also applies to the other string units SU.

A slit SHE extending in the X direction is provided between two select gate lines SGD. The slit SHE separates the select gate line SGD for each string unit SU.

One contact plug CP1 is formed on the two select transistors ST1 formed on each memory pillar MP. That is, the two select transistors ST1 are connected in common to one contact plug CP1. The contact plug CP2 is formed on the contact plug CP1. The contact plug CP2 connects one of the plurality of bit lines BL extending in the Y direction to the contact plug CP1. That is, the two select transistors ST1 provided on a single memory pillar MP are connected in parallel to one bit line BL via the contact plugs CP1 and CP2. For example, the memory pillars MP1 to MP4 are each connected to different bit lines BL. Memory pillars MP, corresponding to each string unit SU, are connected in common to one bit line BL.

5.2 Cross-Sectional Configuration of Memory Cell Array

Figure 31:
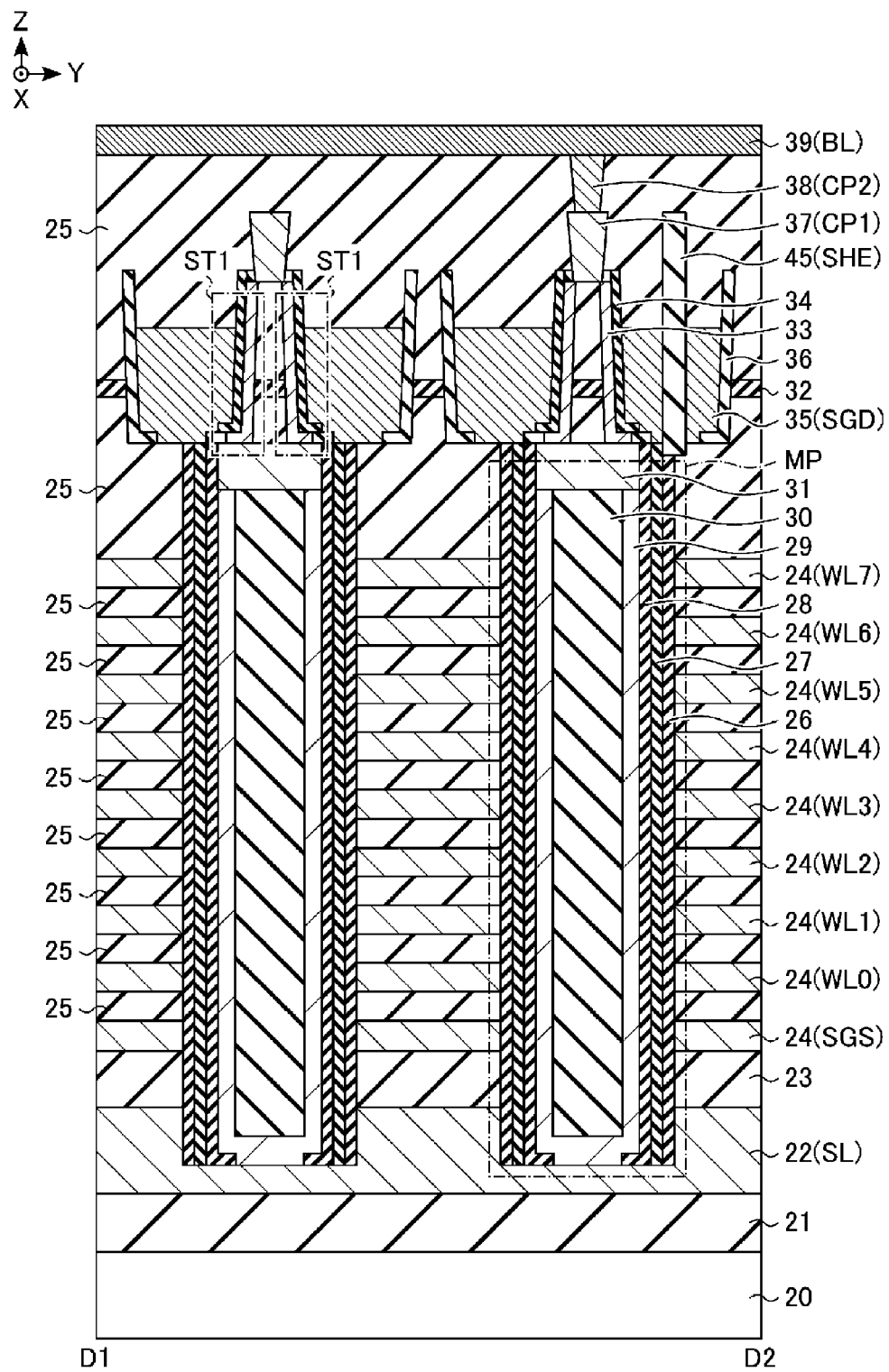
FIG. 31 is a cross-sectional view of the memory cell array in the semiconductor storage device according to the fifth embodiment.

Next, an example of a cross-sectional configuration of the memory cell array 10 will be described by using FIG. 31. FIG. 31 is a cross-sectional view taken along the D1-D2 line of FIG. 30.

As illustrated in FIG. 31, two wiring layers 35 extending in the X direction are formed above the memory pillar MP. For example, the center position of the wiring layer 35 in the Y direction is different from the center position of the memory pillar MP. In the Y direction, the center position of the memory pillar MP is between the two wiring layers 35. That is, the wiring layers 35 are formed above two upper ends of the semiconductor layer 29 in the Y direction, respectively.

The semiconductor layer 33 and the insulating layer 34 are provided between the memory pillar MP and the wiring layer 35. More specifically, the semiconductor layer 33 and the insulating layer 34 are stacked on the side surface and the bottom surface of the trench TR above the memory pillar MP. The insulating layer 36 is formed on the side surface and the bottom surface of the trench TR except for a region where the semiconductor layer 33 and the insulating layer 34 are provided, and on a region between top surfaces of two trenches TR adjacent to each other in the Y direction.

The semiconductor layer 33 and the insulating layer 34 have a crank shape along the bottom surface and the side surface of the wiring layer 35 as in the first embodiment. One select transistor ST1 can be implemented in one portion (left/right) of the semiconductor layer 33, one portion (left/right) of the insulating layer 34, and one portion (left/right) of the wiring layer 35. Therefore, two select transistors ST1 can be provided on one memory pillar MP.

One conductor 37 is formed on both portions of semiconductor layers 33 on the memory pillar MP. That is, the two select transistors ST1 are connected in parallel.

An insulating layer 45 functioning as the slit SHE is provided between two string units SU so as to divide the wiring layer 35 into two in the Y direction. The height position of the bottom portion of the slit SHE in the Z direction is lower than the bottom portion of the wiring layer 35, and is higher than the height position of the upper surface of the uppermost wiring layer 24 functioning as the word line WL7. For the insulating layer 45, for example, $SiO_2$ is used.

5.3 Arrangement of Select Transistor ST1 and Select Gate Line SGD

Figure 32:
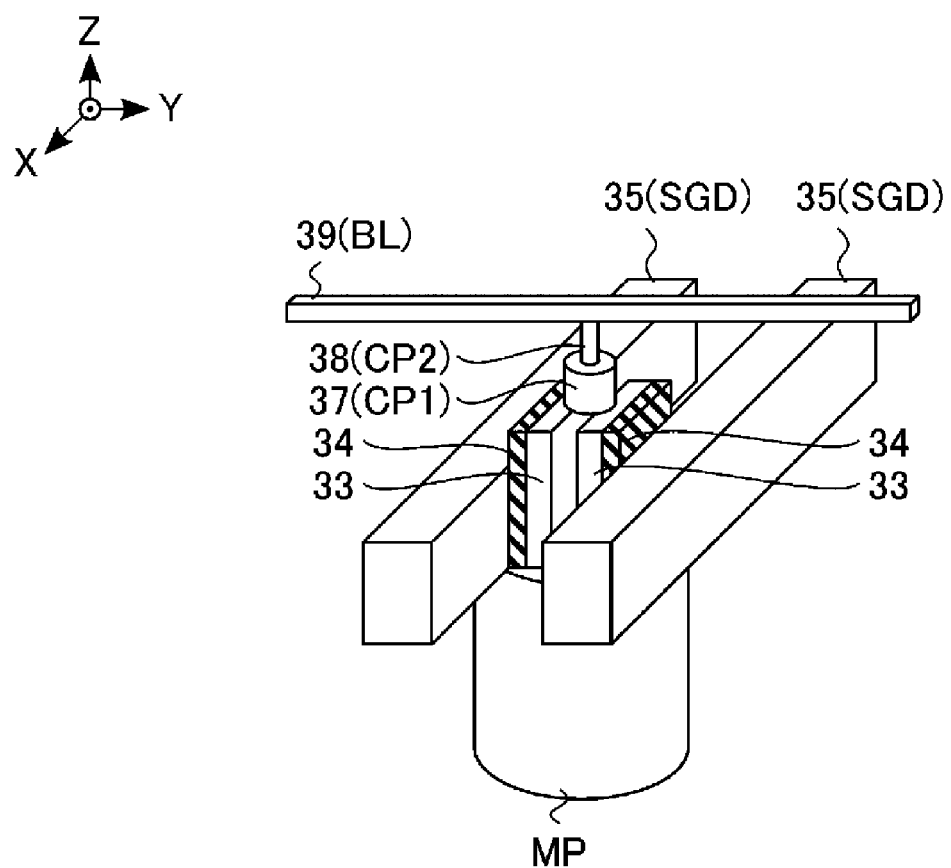
FIG. 32 is a perspective view of a select transistor ST1 in the memory cell array in the semiconductor storage device according to the fifth embodiment.

Next, arrangement of the select transistor ST1 and the select gate line SGD according to the fifth embodiment will be described by using FIG. 32. FIG. 32 is a perspective view illustrating the arrangement of a top portion of the memory pillar MP, the select transistor ST1, the select gate line SGD, the contact plugs CP1 and CP2, and the bit line BL. In the example depicted in FIG. 32, a part of the insulating layers is omitted in order to simplify description. Also, the depiction of the select transistor ST1 is somewhat simplified.

As illustrated in FIG. 32, each of two wiring layers 35 extending in the X direction passes above a part of a region of the memory pillar MP. Two insulating layers 34 in contact with the two wiring layers 35, respectively, and two semiconductor layers 33 in contact with the two insulating layers 34, respectively, are provided on the memory pillar MP. The conductor 37 whose bottom surface is in contact with the two semiconductor layers 33 spans the two semiconductor layers 33. The conductor 38 is provided on the conductor 37. The wiring layer 39 is provided on the conductor 38.

5.4 Manufacturing Method of Memory Cell Array

A manufacturing method of the memory cell array 10 according to the fifth embodiment will be described by using FIG. 33 to FIG. 41. Each of FIG. 33 to FIG. 41 illustrates a plan view and a cross section taken along the B1-B2 line (a B1-B2 section) of the memory cell array 10 during stages of the manufacturing process.

Figure 33:
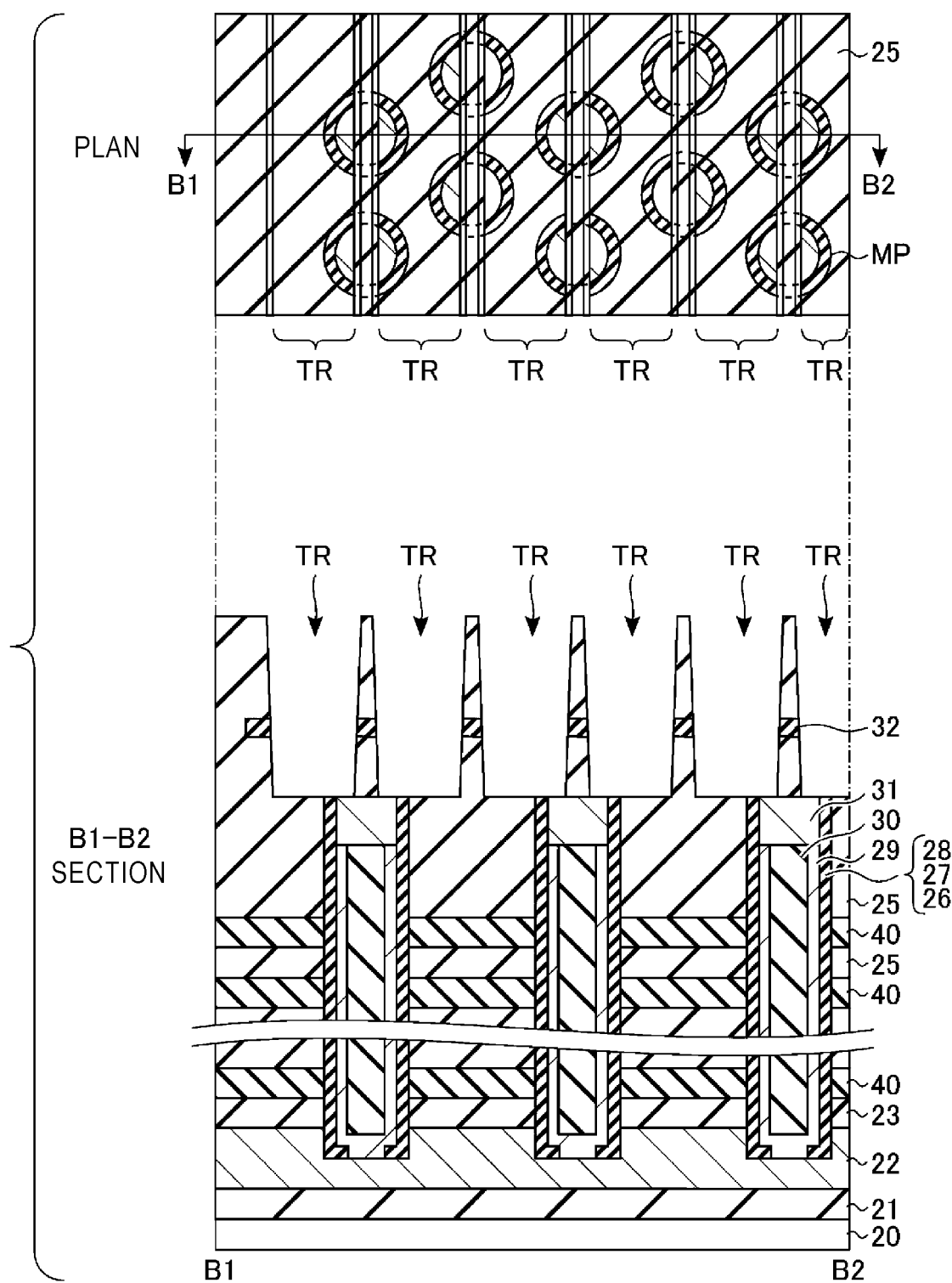
FIGS. 33-41 illustrate aspects of an example of a manufacturing process of a semiconductor storage device according to the fifth embodiment.

As illustrated in FIG. 33, as in FIG. 6 to FIG. 8 in the first embodiment, the memory pillars MP and the trenches TR are formed. At the bottom portion of the trench TR, a part of the upper surface of each of the memory pillars MP arranged in two rows of staggered patterns is exposed.

Figure 34:
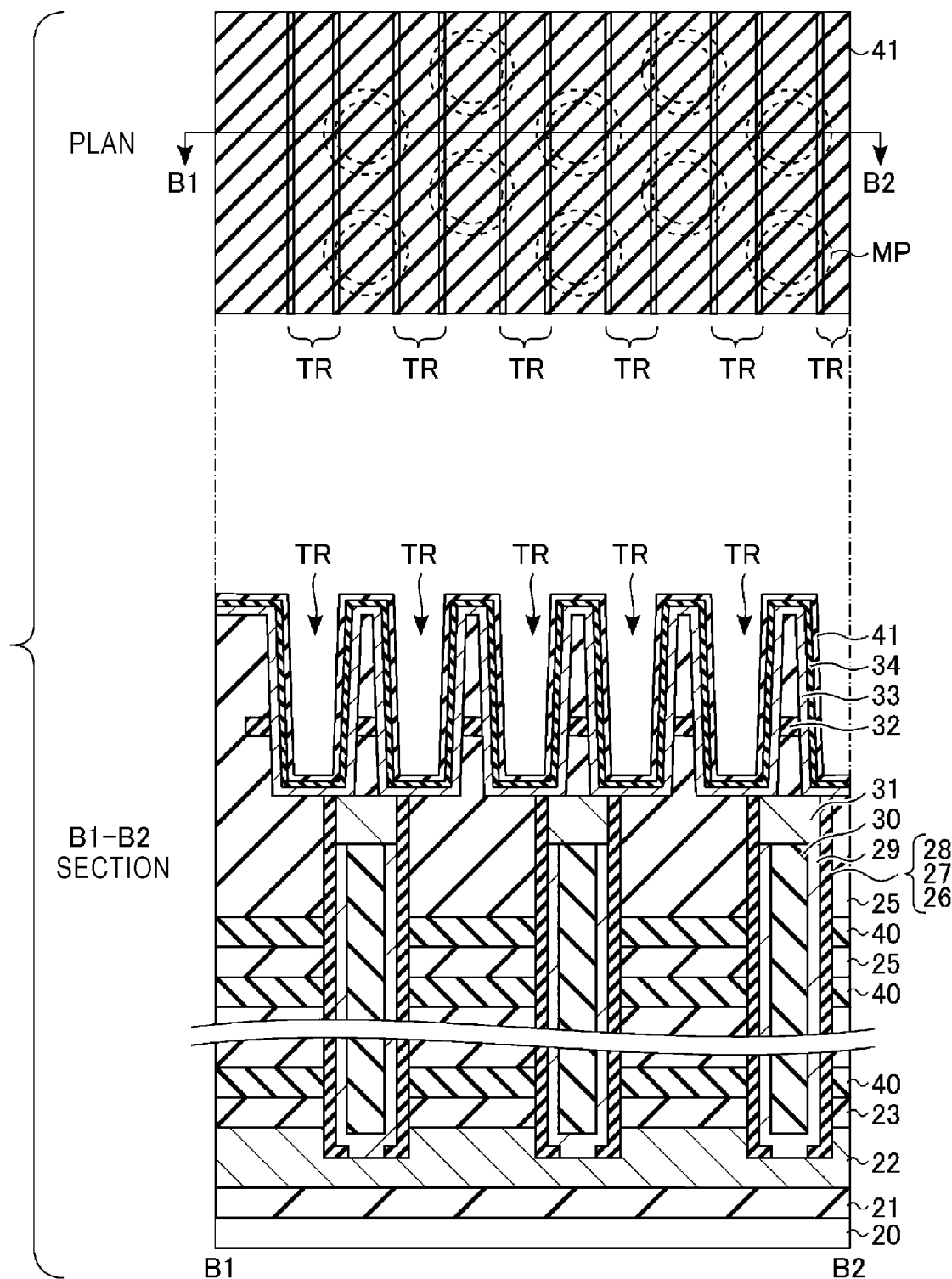

As illustrated in FIG. 34, the semiconductor layer 33, the insulating layer 34, and the insulating layer 41 are sequentially stacked.

Figure 35:
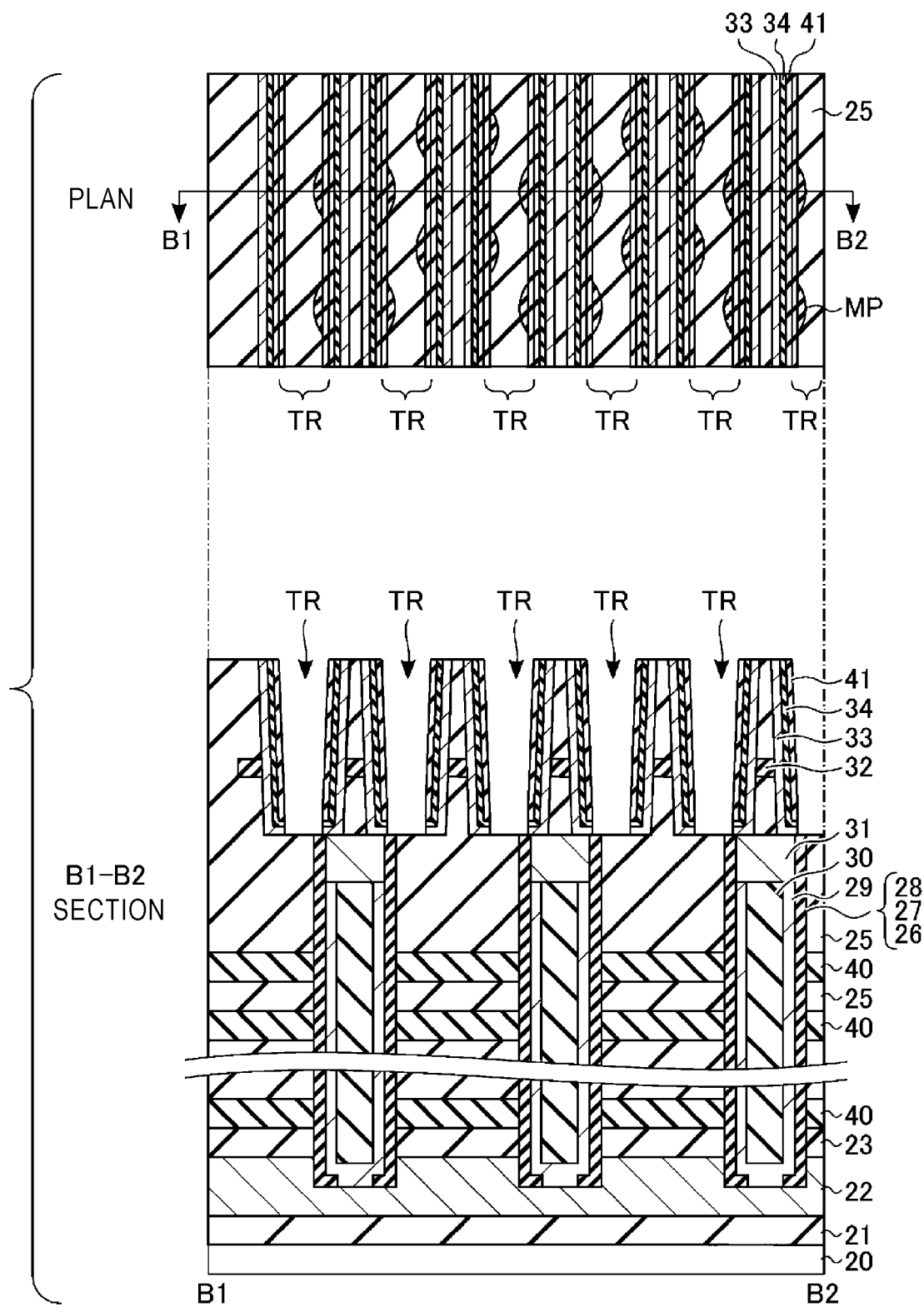

As illustrated in FIG. 35, the semiconductor layer 33, the insulating layer 34, and the insulating layer 41 formed on the uppermost insulating layer 25 and the bottom portion of the trench TR are removed through, for example, RIE. Here, the semiconductor layer 33, the insulating layer 34, and the insulating layer 41 on the side surface of the trench TR remain without being removed.

Figure 36:
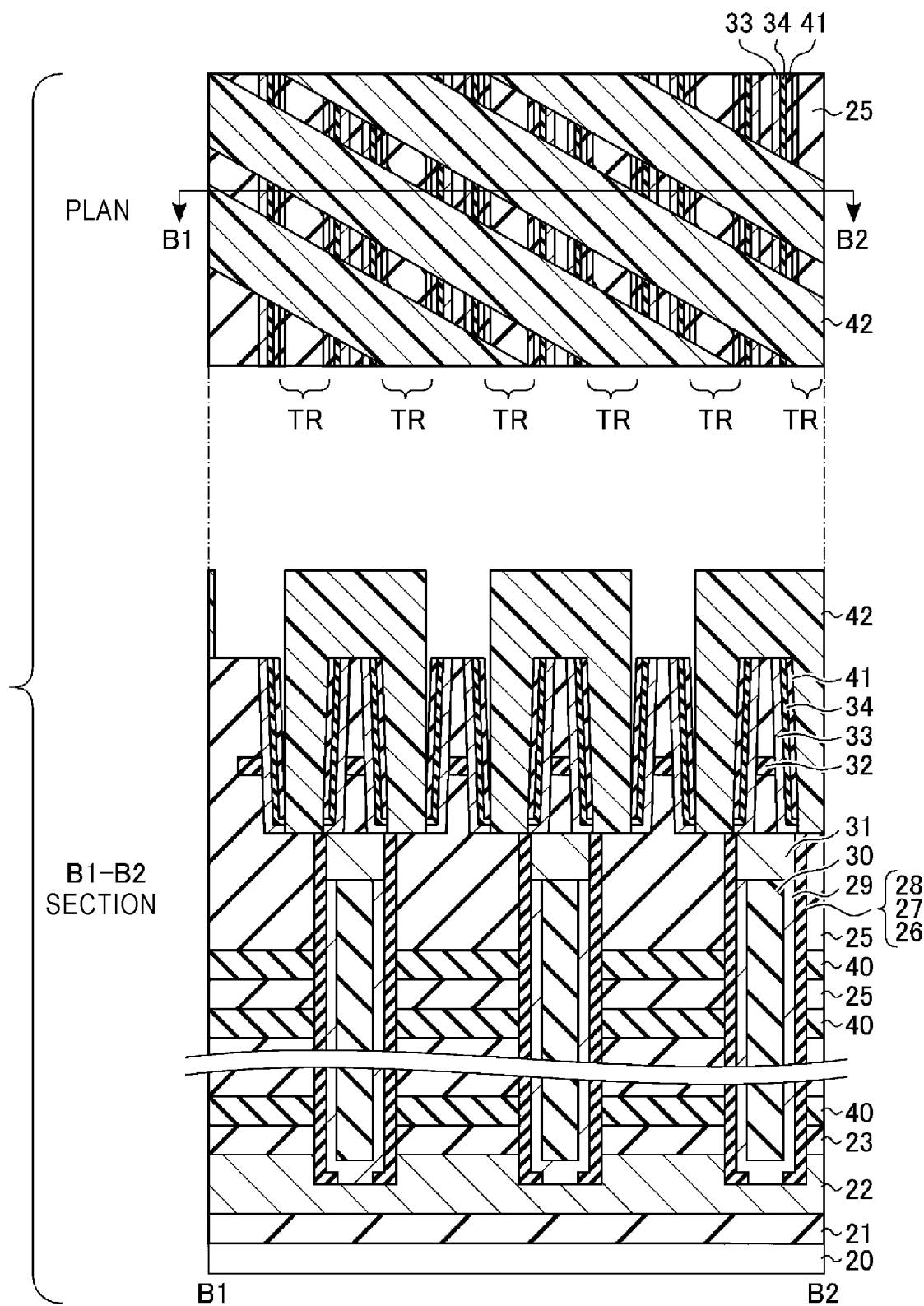

As illustrated in FIG. 36, as in FIG. 17 in the second embodiment, a line pattern using the resist 42 is formed. Here, the resist 42 covers the semiconductor layer 33, the insulating layer 34, and the insulating layer 41 formed on the side surface of the trench TR above the memory pillar MP.

Figure 37:
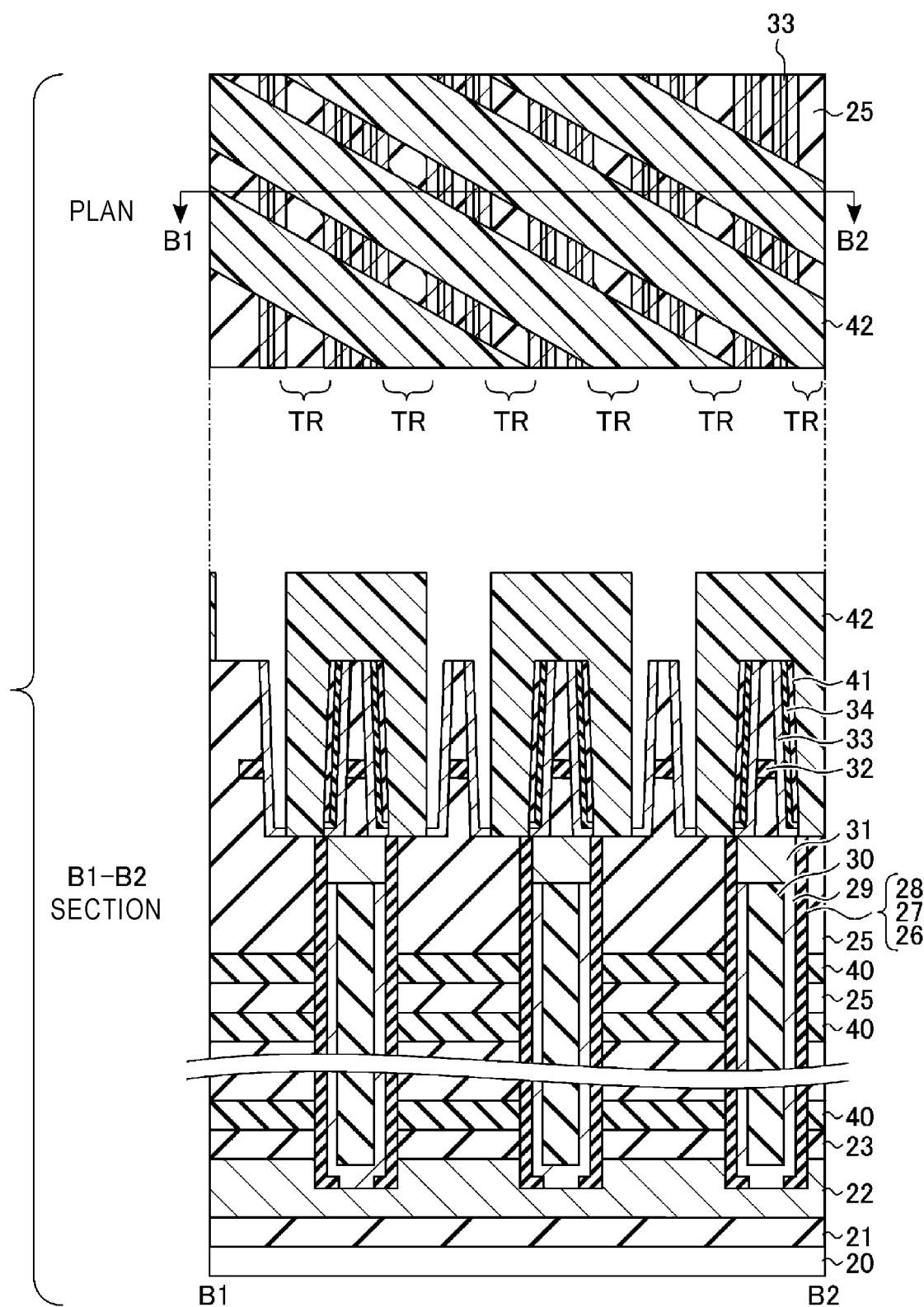

As illustrated in FIG. 37, the insulating layer 34 and the insulating layer 41 in a region not covered with the resist 42 are removed through, for example, chemical dry etching (CDE).

Figure 38:
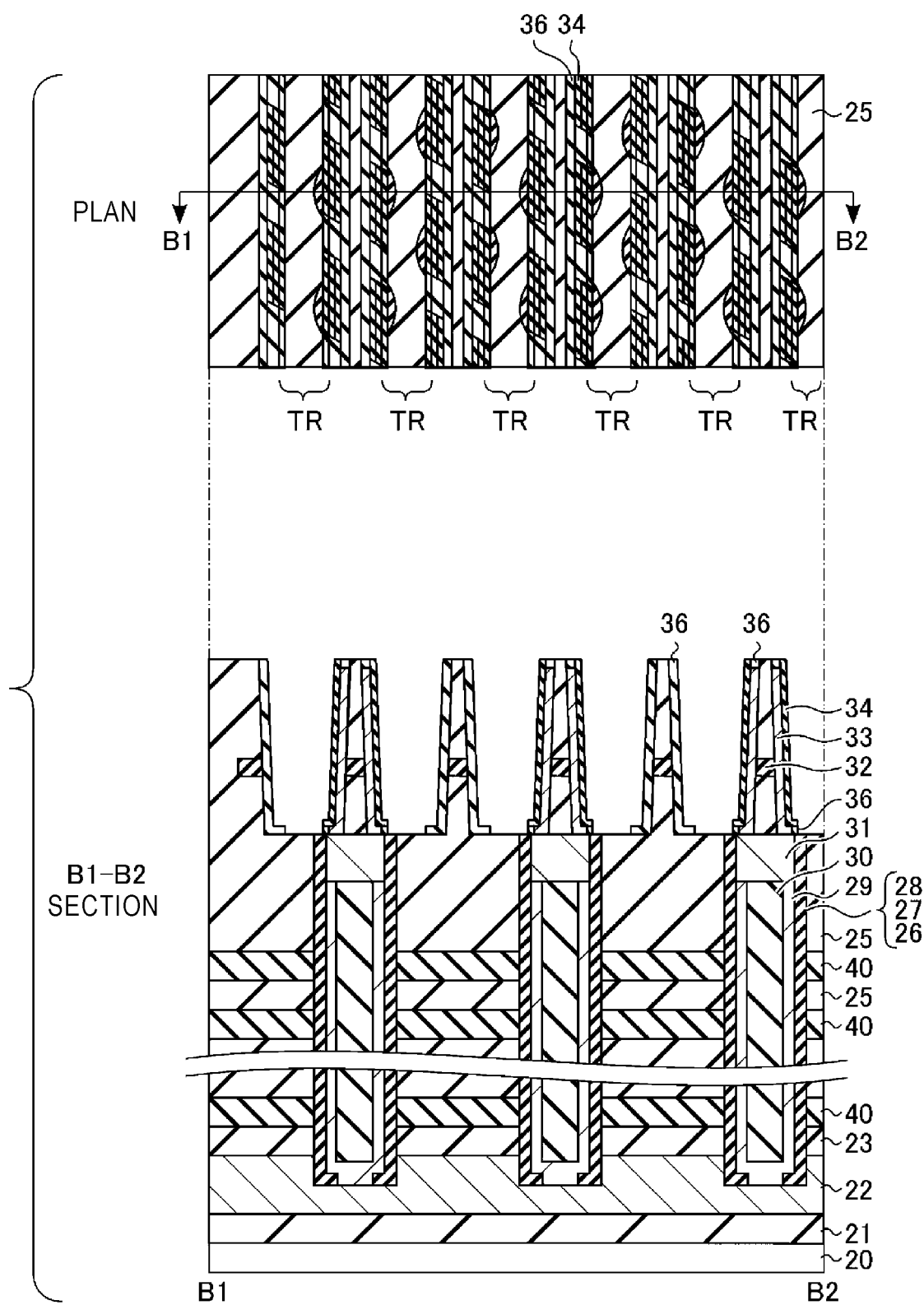

As illustrated in FIG. 38, after the resist 42 is removed, the semiconductor layer 33 is oxidized, and the insulating layer 36 is formed. Here, in a region having a surface covered with the insulating layers 34 and 41, the semiconductor layer 33 is not oxidized. An end region of the semiconductor layer 33 having a surface covered with the insulating layer 34 and the insulating layer 41 may be oxidized in some examples.

Next, the insulating layer 41 is removed by, for example, wet etching.

Figure 39:
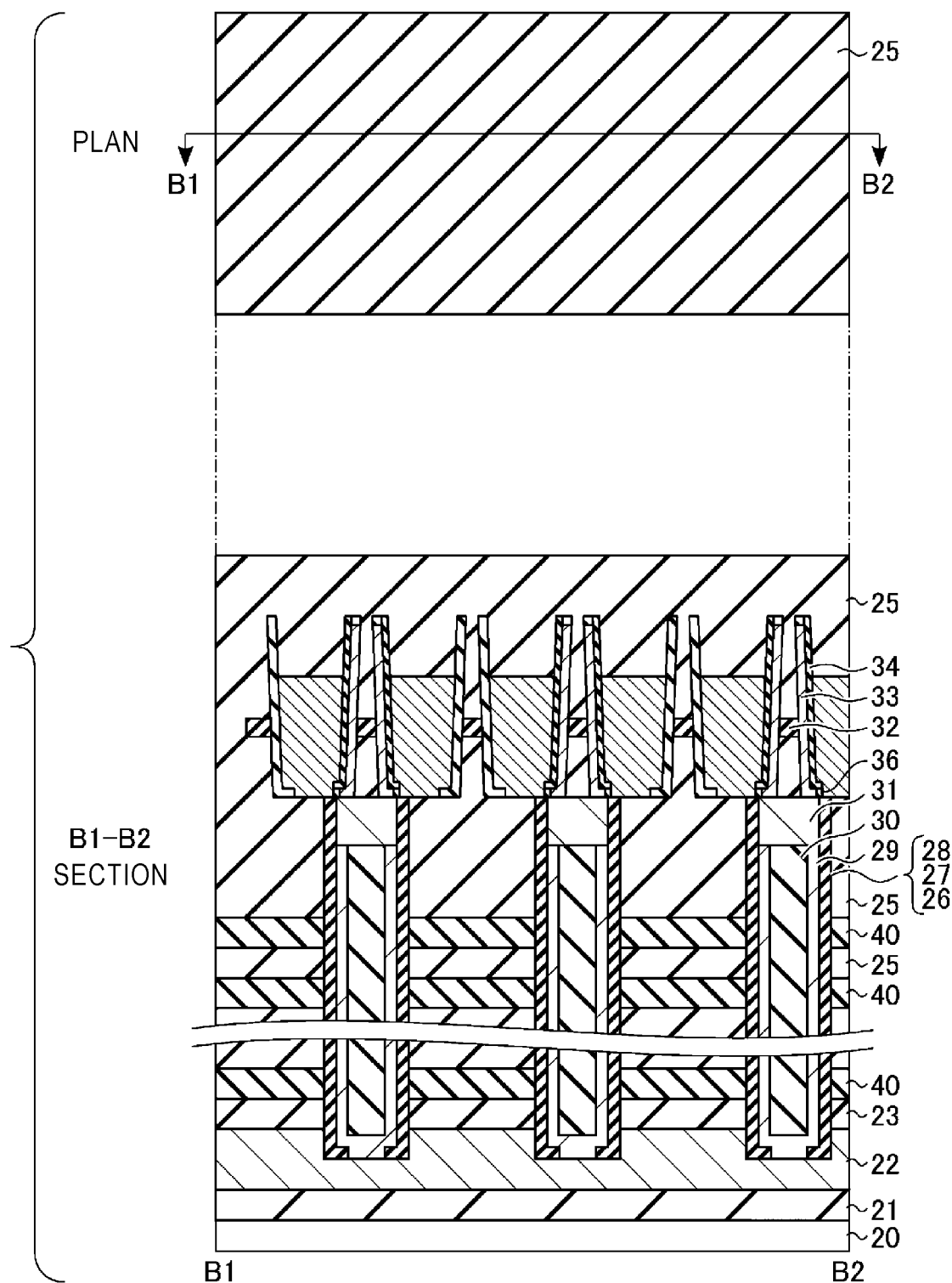

As illustrated in FIG. 39, as in FIG. 11 in the first embodiment, after the wiring layer 35 is formed, the insulating layer 25 is formed.

Figure 40:
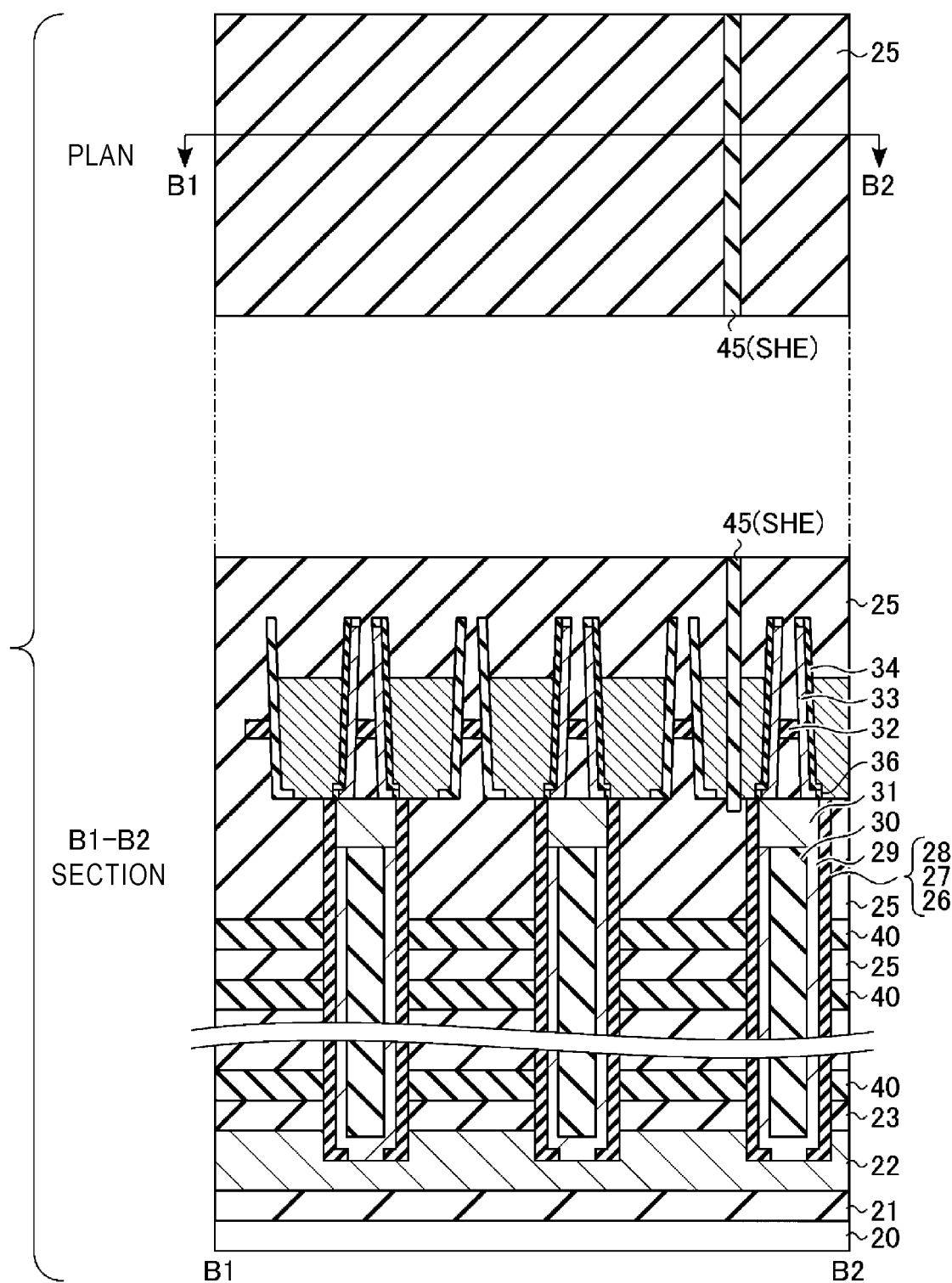

As illustrated in FIG. 40, the slit SHE is processed, and the slit SHE is filled with the insulating layer 45.

Figure 41:
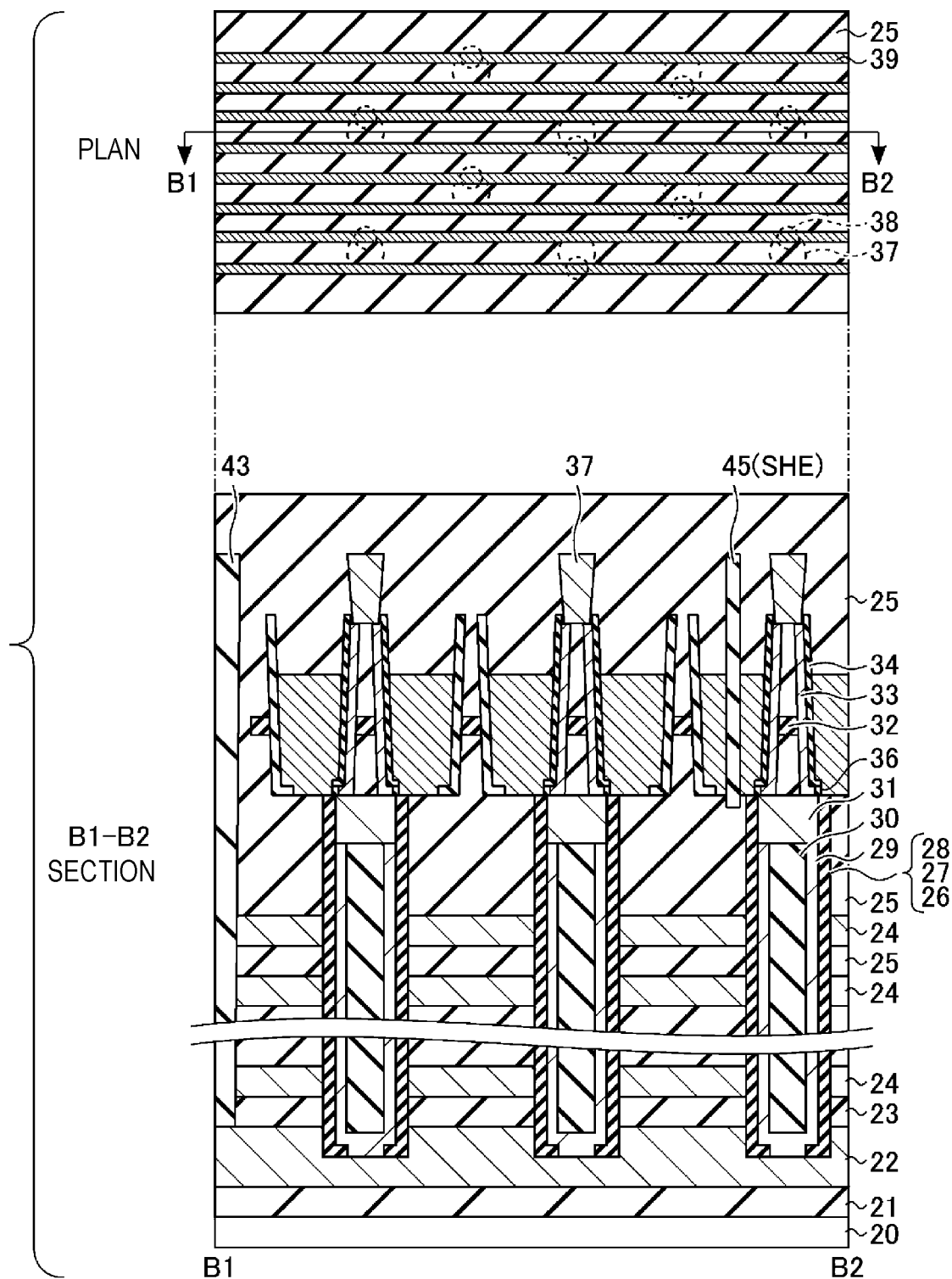

As illustrated in FIG. 41, as in FIG. 12 and FIG. 13 in the first embodiment, after the wiring layers 24 are formed through replacement, the conductor 37 whose bottom surface is in contact with the semiconductor layer 33 is formed.

Next, after the insulating layer 25 is formed, the conductor 38 and the wiring layer 39 are formed.

5.5 Effects in Fifth Embodiment

By the configuration according to the fifth embodiment, the same effect(s) as that in the first embodiment can be obtained.

In the configuration according to the fifth embodiment, two select transistors ST1 may be provided on each memory pillar MP. The two select transistors ST1 may be connected in parallel. Accordingly, an increase of a channel resistance of the select transistor ST1 may be prevented, and a reduction of cell current Icell flowing through the channel region of the memory pillar MP may be prevented. Therefore, it is possible to suppress a decrease of a reading performance of the semiconductor storage device and to improve the reliability.

6. Modifications

A semiconductor storage device according to the above example embodiments includes: a plurality of first wiring layers WL stacked in a first direction (such as a the Z direction); a first memory pillar MP including a first semiconductor layer 29 that extends in the first direction through the plurality of first wiring layers; a second wiring layer 35 disposed above an upper end of the first semiconductor layer; a second semiconductor layer 33 having a first portion 33a disposed between the first semiconductor layer and the second wiring layer, and a second portion 33b extending above the first semiconductor layer; and a first insulating layer 34 disposed between the first portion 33a and the second wiring layer and between the second portion 33b and the second wiring layer.

By applying the above-described embodiments, it is possible to provide a semiconductor storage device in chip area is not increased.

The present disclosure is not limited to the above-described example embodiments, and various modifications may be made thereto.

In the present disclosure, the term "connect" includes a state where an indirect connection is made by interposing something else such as, for example, a transistor or a resistor between connected components or elements.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a plurality of first wiring layers stacked in a first direction;
a first memory pillar including a first semiconductor layer, the first memory pillar extending in the first direction through the plurality of first wiring layers;
a second wiring layer above an upper end of the first semiconductor layer in the first direction;
a second semiconductor layer having a first portion between the first semiconductor layer and the second wiring layer in the first direction and a second portion extending away from the first semiconductor layer; and
a first insulating layer between the first portion and the second wiring layer in the first direction, and between the second portion and the second wiring layer in a second direction intersecting the first direction.

2. The semiconductor storage device according to claim 1, wherein the second semiconductor layer and the first insulating layer each has a crank shape.

3. The semiconductor storage device according to claim 1, further comprising:
a row decoder module connected to the plurality of first wiring layers and the second wiring layer.

4. The semiconductor storage device according to claim 1, wherein the first memory pillar further includes a charge storage layer surrounding the first semiconductor layer.

5. The semiconductor storage device according to claim 1, further comprising:
a second memory pillar including a third semiconductor layer, the second memory pillar extending in the first direction through the plurality of first wiring layers;
a third wiring layer above an upper end of the third semiconductor layer in the first direction;
a fourth semiconductor layer having a third portion between the third semiconductor layer and the third wiring layer in the first direction and a fourth portion extending away from the third semiconductor layer; and a second insulating layer between the third portion and the third wiring layer in the first direction, and between the fourth portion and the third wiring layer in the second direction.

6. The semiconductor storage device according to claim 5, further comprising:
a first conductor electrically connected to the second semiconductor layer and the fourth semiconductor layer.

7. The semiconductor storage device according to claim 6, further comprising:
a fourth wiring layer adjacent to the second wiring layer and above the upper end of the first semiconductor layer in the first direction;
a fifth semiconductor layer having a fifth portion between the first semiconductor layer and the fourth wiring layer in the first direction, and a sixth portion extending away from the first semiconductor layer;
a third insulating layer between the fifth portion and the fourth wiring layer in the first direction, and between the sixth portion and the fourth wiring layer in the second direction; and
a second conductor electrically connected to the second semiconductor layer and the fifth semiconductor layer.

8. The semiconductor storage device according to claim 1, wherein the second semiconductor layer and the first insulating layer each has a mutually corresponding crank shape.

9. The semiconductor storage device according to claim 1, wherein the first portion of the second semiconductor layer extends in the second direction and the second portion of the second semiconductor layer extends upward from the first portion.

10. A semiconductor memory device, comprising:
a plurality of first wiring layers stacked in a first direction;
a first memory pillar including a first semiconductor layer, the first memory pillar extending in the first direction through the plurality of first wiring layers;
a second wiring above an upper end of the first semiconductor layer in the first direction;
a second semiconductor layer having a bent shape including a first portion between the first semiconductor layer and the second wiring layer in the first direction and a second portion extending away from the first semiconductor layer; and
a first insulating layer directly on the second semiconductor layer, the first insulating layer being between the first portion and the second wiring in the first direction, and between the second portion and the second wiring in a second direction intersecting the first direction.

11. The semiconductor memory device according to claim 10, wherein a centerline of the first memory pillar is offset in the second direction from a centerline of the second wiring.

12. The semiconductor memory device according to claim 10, further comprising:
a row decoder module connected to the plurality of first wiring layers and the second wiring.

13. The semiconductor memory device according to claim 10, further comprising:
a second memory pillar including a third semiconductor layer, the second memory pillar extending in the first direction through the plurality of first wiring layers;
a third wiring above an upper end of the third semiconductor layer in the first direction;
a fourth semiconductor layer having a third portion between the third semiconductor layer and the third wiring in the first direction and a fourth portion extending away from the third semiconductor layer;
a second insulating layer between the third portion and the third wiring in the first direction, and between the fourth portion and the third wiring in the second direction; and
a first conductor electrically connected to the second semiconductor layer and the fourth semiconductor layer.

* * * * *